(12) United States Patent
Kim et al.

(10) Patent No.: US 12,477,741 B2
(45) Date of Patent: Nov. 18, 2025

(54) METHODS OF MANUFACTURING SEMICONDUCTOR DEVICES

(71) Applicant: SAMSUNG ELECTRONICS CO., LTD., Suwon-si (KR)

(72) Inventors: Byongju Kim, Suwon-si (KR); Dongsung Choi, Suwon-si (KR); Wonjun Park, Suwon-si (KR); Donghwa Lee, Suwon-si (KR); Jaemin Jung, Suwon-si (KR); Changheon Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 305 days.

(21) Appl. No.: 18/131,924

(22) Filed: Apr. 7, 2023

(65) Prior Publication Data
US 2024/0081075 A1 Mar. 7, 2024

(30) Foreign Application Priority Data
Sep. 2, 2022 (KR) .................. 10-2022-0111430

(51) Int. Cl.
*H10B 43/40* (2023.01)
*H01L 23/528* (2006.01)
(Continued)

(52) U.S. Cl.
CPC ........ *H10B 43/40* (2023.02); *H01L 23/5283* (2013.01); *H01L 25/0652* (2013.01);
(Continued)

(58) Field of Classification Search
CPC ........ H10B 43/40; H10B 41/10; H10B 41/27; H10B 41/35; H10B 41/40; H10B 43/10;
(Continued)

(56) References Cited

U.S. PATENT DOCUMENTS 10,615,169 B2  4/2020  Van Schravendijk et al.
10,700,089 B1  6/2020  Hojo et al.
(Continued)

FOREIGN PATENT DOCUMENTS

KR  10-2016-0136919 A  11/2016
KR  10-2021-0134431 A  11/2021

*Primary Examiner* — Samuel A Gebremariam
(74) *Attorney, Agent, or Firm* — Muir Patent Law, PLLC

(57) ABSTRACT

A method of manufacturing a semiconductor device is provided including the operations of forming a peripheral circuit structure including a substrate, circuit elements on the substrate, and interconnections on the circuit elements. The method includes forming a plate layer on the peripheral circuit structure, forming a preliminary stack structure by alternately stacking sacrificial layers and interlayer insulating layers on the plate layer in a first direction perpendicular to an upper surface of the plate layer, and patterning the stack structure to form a stepped structure to form patterned sacrificial layers and patterned interlayer insulating layers. The method includes forming deposition inhibition layers on exposed surfaces of the patterned interlayer insulating layers, forming selective deposition layers on exposed surfaces of the patterned sacrificial layers, forming channel structures penetrating through the preliminary stack structure in the first direction, and contacting the plate layer.

20 Claims, 27 Drawing Sheets

(51) Int. Cl.
  *H01L 25/065*  (2023.01)
  *H10B 41/10*  (2023.01)
  *H10B 41/27*  (2023.01)
  *H10B 41/35*  (2023.01)
  *H10B 41/40*  (2023.01)
  *H10B 43/10*  (2023.01)
  *H10B 43/27*  (2023.01)
  *H10B 43/35*  (2023.01)
  *H10B 80/00*  (2023.01)

(52) U.S. Cl.
  CPC ............. *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 80/00* (2023.02)

(58) Field of Classification Search
  CPC ........ H10B 43/27; H10B 43/35; H10B 80/00; H01L 23/5283; H01L 25/0652
  See application file for complete search history.

(56) References Cited

U.S. PATENT DOCUMENTS

| | | |
|---|---|---|
| 10,734,244 B2 | 8/2020 | Kim et al. |
| 10,847,529 B2 | 11/2020 | Yoo et al. |
| 11,171,050 B2 | 11/2021 | Yatsuda et al. |
| 11,195,845 B2 | 12/2021 | Yoo et al. |
| 11,296,104 B2 | 4/2022 | Lee et al. |
| 2016/0343727 A1 | 11/2016 | Kim et al. |
| 2021/0151460 A1 | 5/2021 | Kim et al. |
| 2021/0265369 A1 | 8/2021 | Chae et al. |
| 2022/0181141 A1 | 6/2022 | Van Schravendijk et al. |

METHODS OF MANUFACTURING SEMICONDUCTOR DEVICES

CROSS-REFERENCE TO RELATED APPLICATION

Korean Patent Application No. 10-2022-0111430, filed on Sep. 2, 2022, in the Korean Intellectual Property Office, is incorporated herein in its entirety by reference.

BACKGROUND

1. Field

The present inventive concept relates to a method of manufacturing a semiconductor device.

2. Description of the Related Art

In an electronic system requiring data storage, a semiconductor device capable of storing high-capacity data is required. Accordingly, a method for increasing the data storage capacity of the semiconductor device is desirable to increase the amount of data that may be stored in an electronic system.

SUMMARY

Embodiments are directed to a semiconductor device including three-dimensionally arranged memory cells as well as a method of manufacturing such a semiconductor device. An aspect of the present inventive concept is to provide a method of manufacturing a semiconductor device having improved productivity.

Embodiments are also directed to a method of manufacturing a semiconductor device. The method may include the operations of forming a peripheral circuit structure including a substrate, circuit elements on the substrate, and interconnections on the circuit elements. The method may include forming a plate layer on the peripheral circuit structure. The method may include forming a preliminary stack structure by alternately stacking sacrificial layers and interlayer insulating layers on the plate layer in a first direction, perpendicular to an upper surface of the plate layer. The method may include patterning the preliminary stack structure to form a stepped structure to form patterned sacrificial layers and patterned interlayer insulating layers. The method may include forming deposition inhibition layers on exposed surfaces of the patterned interlayer insulating layers. The method may include forming selective deposition layers on exposed surfaces of the patterned sacrificial layers. The method may include forming channel structures penetrating through the preliminary stack structure in the first direction and contacting the plate layer. The method may include forming isolation openings penetrating through the preliminary stack structure in the first direction, and extending in a second direction, parallel to an upper surface of the substrate. The method may include forming horizontal openings by removing the sacrificial layers and the selective deposition layers exposed through the isolation openings. The method may include forming gate electrodes filling the horizontal openings. The method may include forming gate contacts electrically connected to the gate electrodes.

Embodiments are also directed to a method of manufacturing a semiconductor device. The method may include the operations of forming a preliminary stack structure by alternately stacking sacrificial layers and interlayer insulating layers on a plate layer in a first direction, perpendicular to an upper surface of the plate layer. The method may include patterning the preliminary stack structure to form a stepped structure to form patterned sacrificial layers and patterned interlayer insulating layers. The method may include forming deposition suppression layers on exposed surfaces of the patterned interlayer insulating layers by supplying an inhibitor. The method may include forming selective deposition layers on exposed surfaces of the patterned sacrificial layers by supplying a precursor. The method may include forming isolation openings penetrating through the preliminary stack structure in the first direction, and extending in a second direction, parallel to an upper surface of the plate layer. The method may include forming horizontal openings by removing the sacrificial layers and the selective deposition layers exposed through the isolation openings. The method may include forming gate electrodes filling the horizontal openings.

Embodiments are also directed to a method of manufacturing a semiconductor device. The method may include the operations of forming a preliminary stack structure by alternately stacking sacrificial layers and interlayer insulating layers on a plate layer in a first direction, perpendicular to an upper surface of the plate layer. The method may include patterning the preliminary stack structure to form a stepped structure to form patterned sacrificial layers and patterned interlayer insulating layers, and forming preliminary pads, regions in which the sacrificial layers are exposed upwardly. The method may include passivating exposed side surfaces of the patterned interlayer insulating layers by supplying an inhibitor. The method may include forming selective deposition layers on exposed upper and side surfaces of the preliminary pads by supplying a precursor. The method may include forming isolation openings penetrating through the preliminary stack structure in the first direction, and extending in a second direction, parallel to an upper surface of the plate layer. The method may include forming horizontal openings by removing the sacrificial layers and the selective deposition layers exposed through the isolation openings. The method may include forming gate electrodes filling the horizontal openings.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
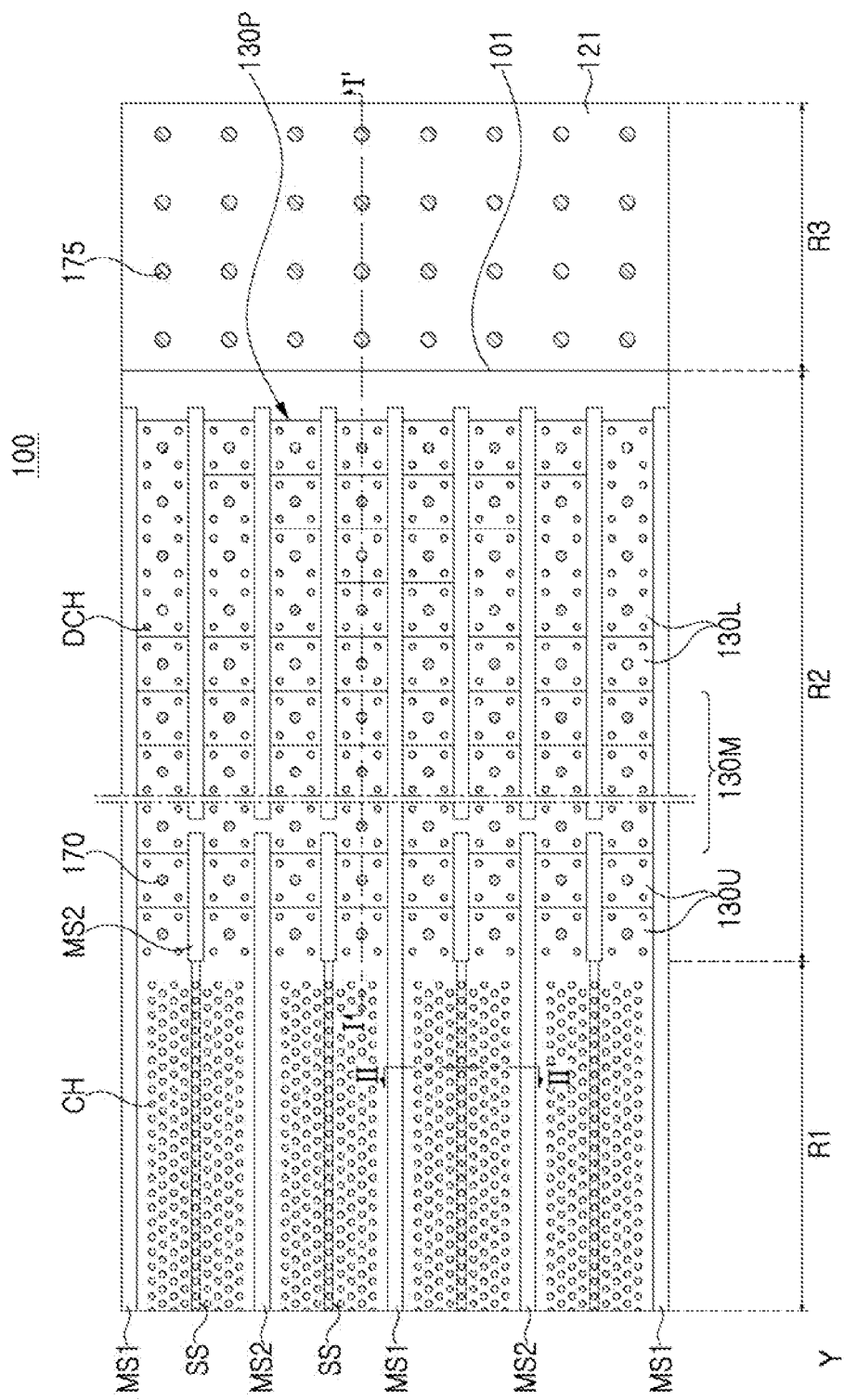
FIG. 1 is a schematic plan view of a semiconductor device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, preferred embodiments of the present inventive concept will be described with reference to the accompanying drawings. For example, as one of the methods for increasing the data storage capacity of the semiconductor device, a semiconductor device including three-dimensionally arranged memory cells instead of two-dimensionally arranged memory cells has been proposed.

FIG. 1 is a schematic plan view of a semiconductor device according to an example embodiment of the present inventive concept.

Figure 2A:
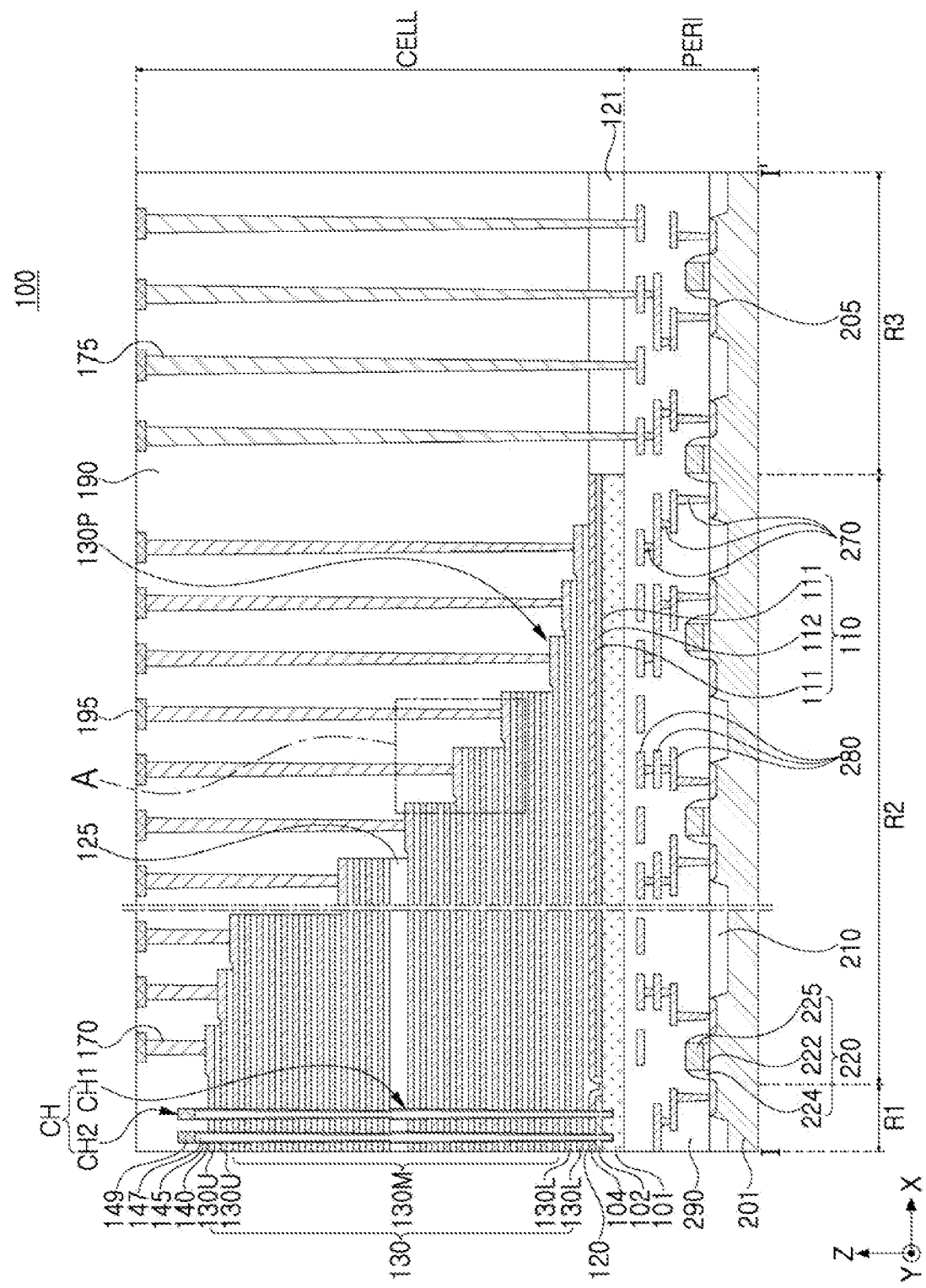
FIGS. 2A and 2B are schematic cross-sectional views of a semiconductor device according to example embodiments.
Figure 2B:
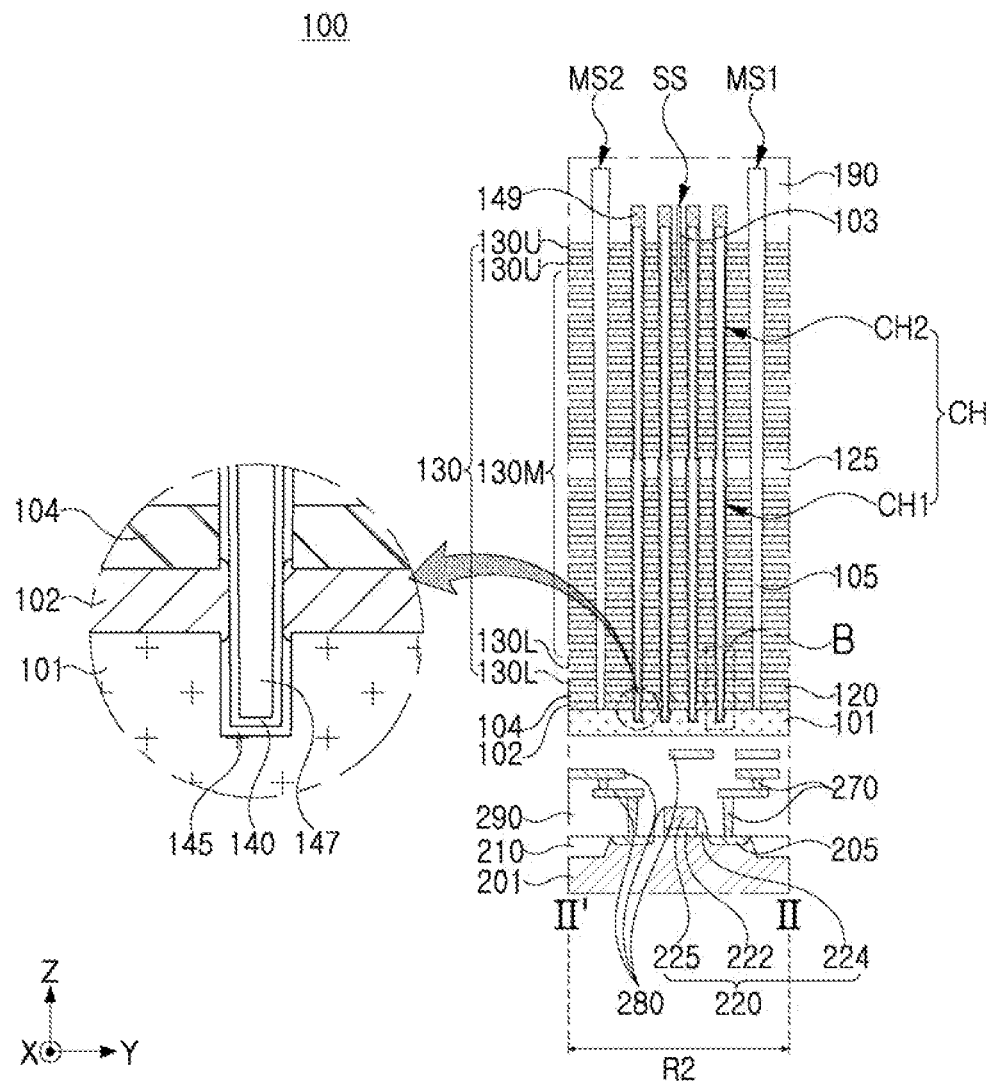

FIGS. 2A and 2B are schematic cross-sectional views of a semiconductor device 100 according to an example embodiment. FIG. 2A illustrates a cross-section taken along the line II-II' in FIG. 1, and FIG. 2B illustrates a cross-section taken along the line II-II' in FIG. 1.

Figure 3:
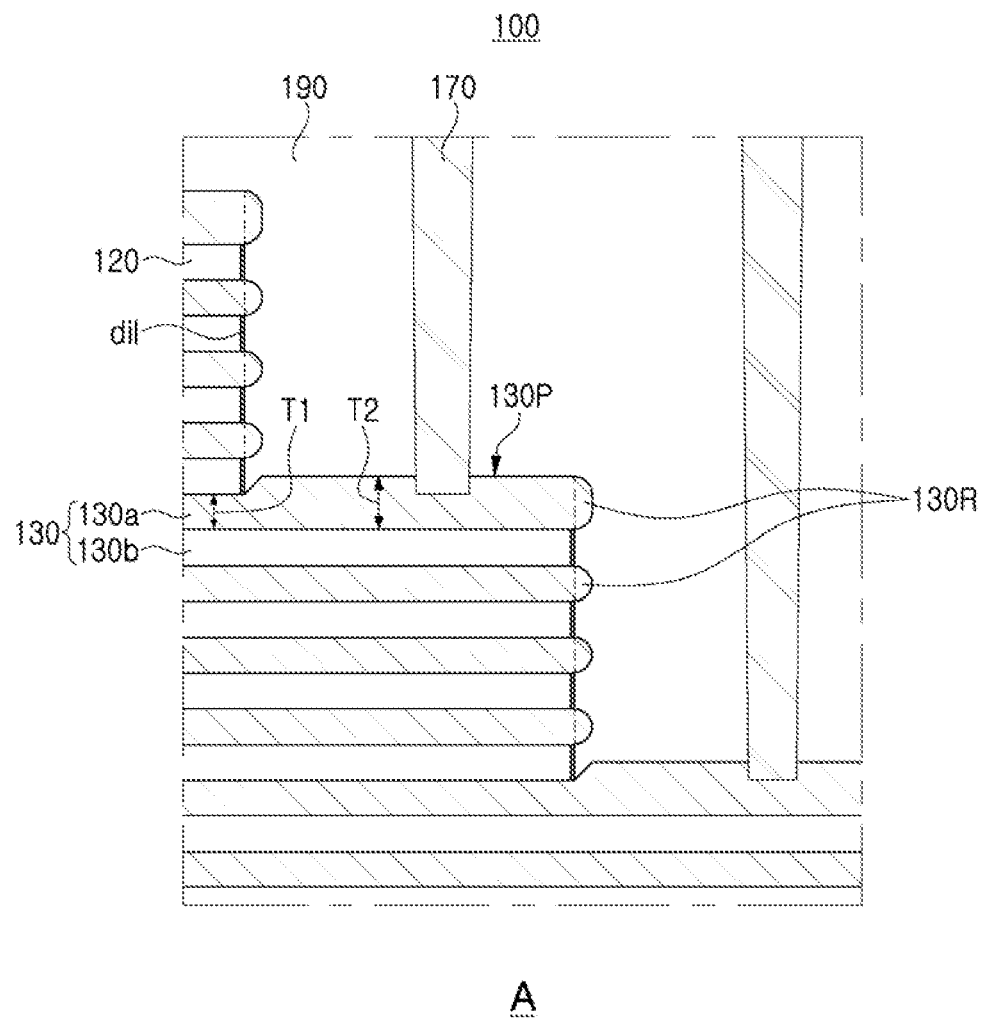
FIG. 3 is a schematic partially enlarged view of a semiconductor device according to an example embodiment.

FIG. 3 is a partially enlarged view illustrating an enlarged portion of a semiconductor device 100 according to an example embodiment of the present inventive concept. In FIG. 3, a region 'A' of FIG. 2A is enlarged and illustrated.

First, referring to FIGS. 1 to 2B, a semiconductor device 100 may include a peripheral circuit region PERI, which is a first semiconductor structure including a substrate 201, and a memory cell region CELL, which is a second semiconductor structure including a plate layer 101. The memory cell region CELL may be disposed above the peripheral circuit region PERI. Conversely, in some example embodiments, the memory cell region CELL may be disposed below the peripheral circuit region PERI.

The peripheral circuit region PERI may include a substrate 201, source/drain regions 205 and device isolation layers 210 in the substrate 201, circuit elements 220 disposed on the substrate 201, circuit contact plugs 270, circuit interconnection lines 280, and a peripheral region insulating layer 290.

The substrate 201 may have an upper surface extending in X-directions and Y-directions. An active region may be defined on the substrate 201 by device isolation layers 210. Source/drain regions 205 containing impurities may be disposed in a portion of the active regions. The substrate 201 may include a semiconductor material, such as a Group IV semiconductor, a Group III-V compound semiconductor, or a Group II-VI compound semiconductor. The substrate 201 may be provided as a bulk wafer or an epitaxial layer.

The circuit elements 220 may include a planar transistor. Each of the circuit elements 220 may include a circuit gate dielectric layer 222, a spacer layer 224, and a circuit gate electrode 225. Source/drain regions 205 may be disposed in the substrate 201 on both sides of the circuit gate electrode 225.

The peripheral region insulating layer 290 may be disposed on the circuit elements 220 on the substrate 201. The circuit contact plugs 270 may penetrate through the peripheral region insulating layer 290 and be connected to the source/drain regions 205. An electrical signal may be applied to the circuit elements 220 by circuit contact plugs 270. In a region not illustrated, circuit contact plugs 270 may also be connected to the circuit gate electrode 225. The circuit interconnection lines 280 may be connected to the circuit contact plugs 270 and may be disposed in a plurality of layers.

The memory cell region CELL may include a plate layer 101 having a first region R1 and a second region R2, gate electrodes 130 stacked on the plate layer 101, interlayer insulating layers 120 alternately stacked with the gate electrodes 130, and channel structures CH disposed to penetrate through the preliminary stack structure of the gate electrodes 130. The memory cell region CELL may further include first and second isolation regions MS1 and MS2 extending to penetrate through the preliminary stack structure of the gate electrodes 130, gate contacts 170 extending through the gate electrodes 130 in the second region R2, and through plugs 175 disposed in a third region R3 outside the plate layer 101. The memory cell region CELL may further include contact plug insulating layers 160 surrounding the gate contacts 170.

The memory cell region CELL may further include a first planar conductive layer 102 on the first region R1, a planar insulating layer 110 disposed parallel to the first planar conductive layer 102 on the second region R2 of the plate layer 101, a second planar conductive layer 104 on the first planar conductive layer 102 and the planar insulating layer 110, and a substrate insulating layer 121 penetrating through the plate layer 101. The memory cell region CELL may further include upper isolation regions SS penetrating through a portion of the stack structure, dummy channel structures DCH, a cell region insulating layer 190, and cell interconnection lines 195, disposed to penetrate through the stack structure of gate electrodes 130 in the second region R2.

The first region R1 of the plate layer 101 is a region in which the gate electrodes 130 are vertically stacked and channel structures CH are disposed and may be a region in which memory cells are disposed. The second region R2 is a region in which the gate electrodes 130 may extend to different lengths and may correspond to a region for electrically connecting the memory cells to the peripheral circuit region PERI. The second region R2 may be disposed on at least one end of the first region R1 in at least one direction, for example, in an X-direction.

The plate layer 101 may have an upper surface extending in X-directions and Y-directions. The plate layer 101 may include a semiconductor material, such as a Group IV semiconductor, a Group III-V compound semiconductor, or a Group II-VI compound semiconductor. For example, the group IV semiconductor may include silicon, germanium, or silicon-germanium. The plate layer 101 may further include impurities. The plate layer 101 may be provided as a polycrystalline semiconductor layer such as a polycrystalline silicon layer or an epitaxial layer.

The first and second planar conductive layers 102 and 104 may be sequentially stacked and disposed on the upper surface of the first region R1 of the plate layer 101. The first planar conductive layer 102 may not extend into the second region R2 of the plate layer 101, and the second planar conductive layer 104 may extend into the second region R2.

The first planar conductive layer 102 may function as part of a common source line of the semiconductor device 100, and may function a common source line together with the plate layer 101. As illustrated in the enlarged view of FIG. 2B, the first planar conductive layer 102 may be directly connected to the channel layer 140, around the channel layer 140.

The second planar conductive layer 104 may contact the plate layer 101 in in a portion of regions in which the first planar conductive layer 102 and the planar insulating layer 110 are not disposed. The second planar conductive layer 104 may cover an end portion of the first planar conductive layer 102 or the planar insulating layer 110 in the portion of regions and may be bent and extended onto the plate layer 101.

The first and second planar conductive layers 102 and 104 may include a semiconductor material, and for example, both the first and second planar conductive layers 102 and 104 may include polycrystalline silicon. In this example, at least the first planar conductive layer 102 may be a doped layer, and the second planar conductive layer 104 may be a doped layer or a layer containing impurities diffused from the first planar conductive layer 102. However, according to example embodiments, the second planar conductive layer 104 may be replaced with an insulating layer.

The planar insulating layer 110 may be disposed on the plate layer 101 parallel to the first planar conductive layer 102 in at least a portion of the second region R2. The planar insulating layer 110 may include first and second planar insulating layers 111 and 112 alternately stacked on the second region R2 of the plate layer 101. According to example embodiments, the first planar insulating layers 111 may be a plurality of layers covering upper and lower surfaces of the second planar insulating layer 112. The planar insulating layer 110 may be layers remaining after a portion of the planar insulating layer 110 are replaced with the first planar conductive layer 102 in the manufacturing process of the semiconductor device 100.

The planar insulating layer 110 may include silicon oxide, silicon nitride, silicon carbide, or silicon oxynitride. The first planar insulating layers 111 and the second planar insulating layer 112 may include different insulating materials. For example, the first planar insulating layers 111 may be formed of the same material as the interlayer insulating layers 120, and the second planar insulating layer 112 may be formed of a different material from the interlayer insulating layers 120.

The substrate insulating layer 121 may extend in a first direction in the second region R2 and may be disposed to penetrate through the plate layer 101, the planar insulating layer 110, and the second planar conductive layer 104. The substrate insulating layer 121 may be disposed to surround the gate contacts 170, respectively. Accordingly, the gate contacts 170 connected to the different gate electrodes 130 may be electrically separated from each other. The substrate insulating layer 121 may also be disposed outside the third region R3, that is, the plate layer 101. The substrate insulating layer 121 may include, for example, silicon oxide, silicon nitride, silicon carbide, or silicon oxynitride.

The gate electrodes 130 may be stacked on the plate layer 101 to be vertically spaced apart to form a stack structure. The gate electrodes 130 may include lower gate electrodes 130L forming gates of ground select transistors, memory gate electrodes 130M forming a plurality of memory cells, and upper gate electrodes 130U forming gates of string select transistors. The number of memory gate electrodes 130M forming memory cells may be determined according to the capacity of the semiconductor device 100. According to example embodiments, the number of upper and lower gate electrodes 130U and 130L may be 1 to 4 or more, respectively, and may have the same structure as or a different structure from the memory gate electrodes 130M. According to example embodiments, the gate electrodes 130 may further include a gate electrode 130 disposed above the upper gate electrodes 130U and/or below the lower gate electrodes 130L, and constituting an erase transistor used for an erase operation using a gate induced drain leakage (GIDL) phenomenon. In addition, a portion of the gate electrodes 130, e.g., memory gate electrodes 130M, adjacent to the upper or lower gate electrodes 130U and 130L may be dummy gate electrodes.

The gate electrodes 130 may be stacked on the first region R1, to be vertically spaced apart from each other, and may extend to the second region R2 to have different lengths, to form a stepped structure. As illustrated in FIG. 2A, the gate electrodes 130 may form a stepped structure between the gate electrodes 130 in the X-direction and may also be arranged to have a stepped structure from each other in the Y-direction.

Due to the stepped structure, the lower gate electrode 130L extends further than the upper gate electrode 130U, so that the gate electrodes 130 may have regions exposed from the interlayer insulating layers 120 upwardly, respectively, and the regions may be referred to as pad regions 130P. In each of the gate electrode 130, the pad region 130P may be a region including an end portion in the X-direction. The gate electrodes 130 may be connected to the gate contact 170 in the pad regions 130P. Other regions, other than the pad region 130P in each of the gate electrodes 130 may be referred to as a stacked region 130G. The stacked region 130G may be a portion that is not exposed upwardly from the interlayer insulating layers 120.

The gate electrodes 130 may have an increased thickness in the pad regions 130P, The thickness of each of the gate electrodes 130 may increase in such a manner that a level of a lower surface thereof is constant, and a level of an upper surface thereof is increased. As illustrated in FIG. 3, the gate electrodes 130 may extend from the first region R1 toward the second region R2 with a first thickness T1, and may have a second thickness T2, thicker than the first thickness T1, in the pad regions 130P, indicated by a dotted line in FIG. 3. The second thickness T2 may be in a range of about 150% to about 210% of the first thickness T1.

The gate electrodes 130 may be disposed to be isolated from each other in the Y-direction by first isolation regions MS1 extending in the X-direction. The gate electrodes 130 between the pair of first isolation regions MS1 may form one memory block. The gate electrodes 130 may include a metal material, such as tungsten (W). According to example embodiments, the gate electrodes 130 may include polycrystalline silicon or a metal silicide material. According to example embodiments, the gate electrodes 130 may further include an anti-diffusion layer. For example, the anti-diffusion layer may include tungsten nitride (WIN), tantalum nitride (TaN), titanium nitride (TiN), or a combination thereof.

The interlayer insulating layers 120 may be disposed between the gate electrodes 130. Like the gate electrodes 130, the interlayer insulating layers 120 may be spaced apart from each other in a direction, perpendicular to an upper surface of the plate layer 101 and may be disposed to extend in the X-direction. The interlayer insulating layers 120 may include an insulating material such as silicon oxide or silicon nitride.

The first and second isolation regions MS1 and MS2 may be disposed to extend in the X-direction through the gate electrodes 130. The first and second isolation regions MS1 and MS2 may be disposed parallel to each other. The first and second isolation regions MS1 and MS2 may be connected to the plate layer 101 through an entirety of the gate electrodes 130 stacked on the plate layer 101. The first isolation regions MS1 may extend together in the X-direction, and the second isolation regions MS2 may intermittently extend between a pair of first isolation regions MS1 or may be disposed only in a portion of regions. As illustrated in FIG. 2B, an isolation insulating layer 105 may be disposed in the first and second isolation regions MS1 and MS2.

As illustrated in FIG. 1, the upper isolation regions SS may extend in the X-direction between the first isolation regions MS1 and the second isolation regions MS2 in the first region R1. As illustrated in FIG. 2B, the upper isolation regions SS may isolate, for example, a total of three gate electrodes 130 including the upper gate electrodes 130U from each other in the Y-direction. However, the number of gate electrodes 130 isolated by the upper isolation regions SS may be variously changed in example embodiments. Upper gate electrodes 130l) isolated by upper isolation regions SS may form different string selection lines. An upper isolation insulating layer 103 may be disposed in the upper isolation regions SS. The upper isolation insulating layer 103 may include an insulating material, for example, silicon oxide, silicon nitride, or silicon oxynitride.

As illustrated in FIG. 1, the channel structures CH form one memory cell string, respectively, and may be disposed on the first region R1 to be spaced apart from each other while forming rows and columns. The channel structures CH may be disposed to form a lattice pattern or may be disposed in a zigzag shape in one direction. The channel structures CH may have a columnar shape and may have inclined side surfaces that become narrower closer to the plate layer 101 according to an aspect ratio.

As illustrated in FIG. 2A, the channel structures CH may include first and second channel structures CH1 and CH2, vertically stacked. Each of the channel structures CH may have a form in which a first connection structure CH1 may be penetrating through a lower stack structure of the gate electrodes 130 and a second channel structure CH2 may be penetrating through an upper stack structure of the gate electrodes 130. Each of the first and second channel structures CH1 and CH2 may be connected, and may have a bent portion due to a difference in width in the connection region. However, according to example embodiments, the number of channel structures stacked in a Z-direction may be variously changed.

As illustrated in the enlarged view of FIG. 2B, a channel layer 140 may be disposed in channel structures CH. In the channel structures CH, a channel layer 140 may be formed in an annular shape surrounding a channel filling insulating layer 147 therein. The channel layer 140 may be connected to a first planar conductive layer 102 therebelow. The channel layer 140 may include a semiconductor material such as polycrystalline silicon or single crystal silicon.

The gate dielectric layer 145 may be disposed between the gate electrodes 130 and the channel layer 140. Although not specifically illustrated, the gate dielectric layer 145 may include a tunneling layer, a charge storage layer, and a blocking layer, sequentially stacked from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. According to example embodiments, at least a portion of the gate dielectric layer 145 may extend in a horizontal direction along the gate electrodes 130. A channel pad 149 may be disposed only at an upper end of a second channel structure CH2 thereabove. The channel pad 149 may include, for example, doped polycrystalline silicon.

The channel layer 140, the gate dielectric layer 145, and the channel filling insulating layer 147 may be connected to each other between the first channel structure CH1 and the second channel structure CH2. An upper interlayer insulating layer 125 having a relatively thick thickness may be disposed between the first channel structure CH1 and the second channel structure CH2, that is, between the lower stack structure and the upper stack structure. However, the shapes of the interlayer insulating layers 120 and the upper interlayer insulating layer 125 may be variously changed in embodiments.

A plurality of dummy channel structures DCH may be disposed to be spaced apart from each other while forming rows and columns in the second region R2. The dummy channel structures DCH may have a larger size than the channel structures CH in a plan view. The dummy channel structures DCH may also be further disposed in a portion of the first region R1, adjacent to the second region R2. The dummy channel structures DCH may not be electrically connected to interconnection structures thereabove, and may not form a memory cell string, unlike the channel structures CH in the semiconductor device 100.

The dummy channel structures DCH may have the same or different structure from the channel structures CH. When the dummy channel structures DCH are formed together with the channel structures CH, the dummy channel structures DCH may have the same structure as the channel structures CH.

The gate contacts 170 may be connected to the pad regions 130P of the gate electrodes 130 in the second region R2. The gate contacts 170 may be disposed to penetrate through at least a portion of the cell region insulating layer 190 and be connected to each of the pad regions 130P of the gate electrodes 130 exposed upwardly.

The gate contacts 170 may include, for example, at least one of tungsten (W), copper (Cu), aluminum (Al), and an alloy thereof. According to example embodiments, the gate contacts 170 may further include barrier layers on sidewalls and bottom surfaces of contact holes in which the gate contacts 170 are disposed. The barrier layer may include, for example, at least one of titanium (Ti), titanium nitride (TiN), tantalum (Ta), and tantalum nitride (TaN). The gate contacts 170 may recess upper portions of the gate electrodes 130.

Referring to FIG. 3, the gate electrodes 130 may have an increased thickness in the pad regions 130P. A thickness of each of the gate electrodes 130 may increase in such a manner than a level of a lower surface thereof is constant, and a level of an upper surface thereof is increased. As illustrated in FIG. 3, the gate electrodes 130 extend from the first region R1 toward the second region R2 with a first thickness T1, and as illustrated in the enlarged portion of FIG. 3, the gate electrodes 130 may have a second thickness T2, greater than the first thickness T1 in the pad regions 130P. The gate electrodes 130 may include a first gate electrode 130a and a second gate electrode 130b therebelow, forming the pad region 130P.

The through plugs 175 may be disposed in the third region R3 of the memory cell region CELL, which is an outer region of the plate layer 101, and may penetrate through the cell region insulating layer 190 and extend to the peripheral circuit region PERI. The through plugs 175 may be disposed to connect cell interconnection lines 195 of the memory cell region CELL and circuit interconnection lines 280 of the peripheral circuit region PERI. The through plugs 175 may include a conductive material, for example, a metal material such as tungsten (W), copper (Cu), aluminum (Al), or the like.

The cell region insulating layer 190 may be disposed to cover the plate layer 101, the gate electrodes 130 on the plate layer 101 and the peripheral region insulating layer 290. The cell region insulating layer 190 may be formed of an insulating material or may be formed of a plurality of insulating layers.

The cell interconnection lines 195 may constitute an upper interconnection structure electrically connected to memory cells in the memory cell region CELL. The cell interconnection lines 195 may be connected to the gate contacts 170 and through plugs 175, and may be electrically connected to the gate electrodes 130 and the channel structures CH. According to example embodiments, the number of cell interconnection lines 195, gate contacts 170, and through plugs 175 constituting the upper interconnection structure may be variously changed. The cell interconnection lines 195 may include metal, for example, tungsten (W), copper (Cu), or aluminum (Al).

Figure 4:
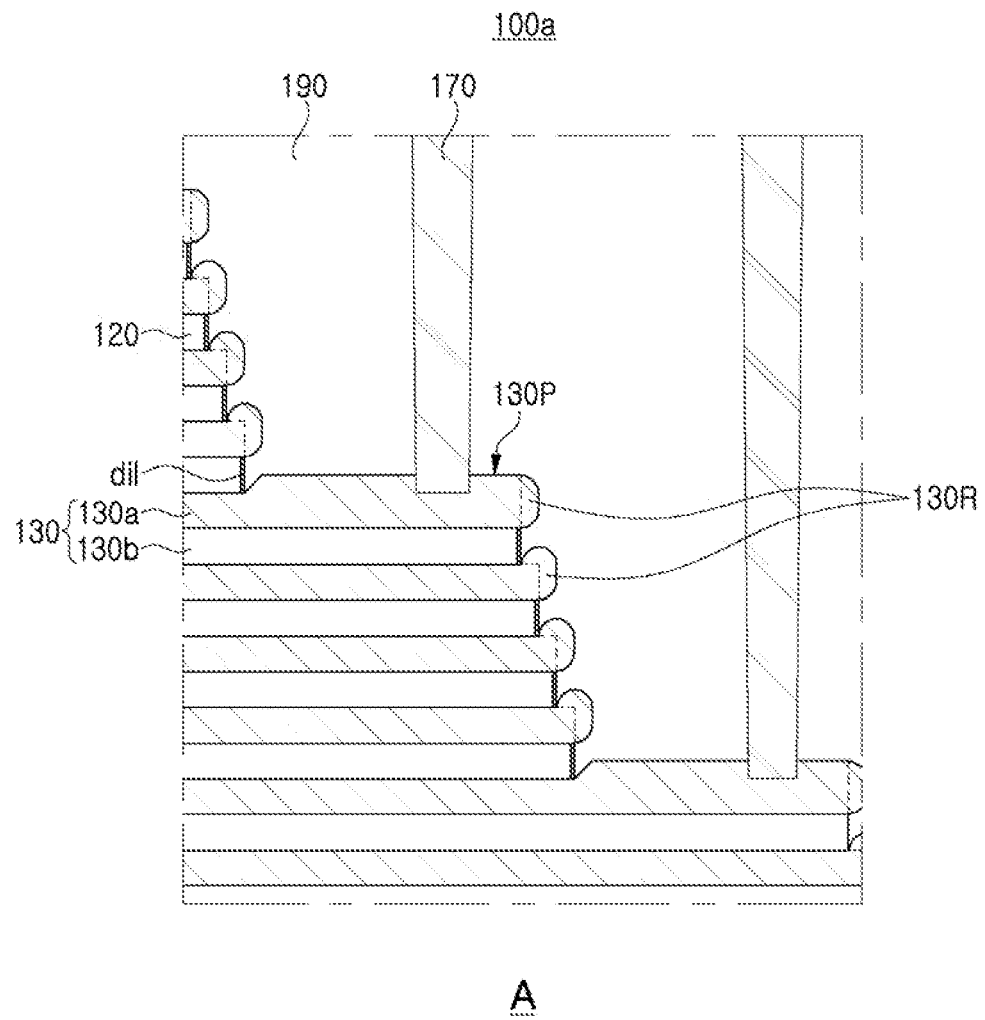
FIG. 4 is a schematic partially enlarged view of a semiconductor device according to an example embodiment.

FIG. 4 is a schematic partially enlarged view of a semiconductor device according to an example embodiment of the present inventive concept. In FIG. 4, a region corresponding to region of FIG. 2A is enlarged and illustrated.

Referring to FIG. 4, unlike the example embodiment of FIGS. 1 to 3, in a semiconductor device 100a, the gate electrodes 130 may extend downwardly to a relatively greater length in an X-direction. A portion of an upper surface of the second gate electrode 130b may be exposed from the interlayer insulating layer 120, and a gate protrusion portion 130R may be formed in the exposed region.

Figure 5:
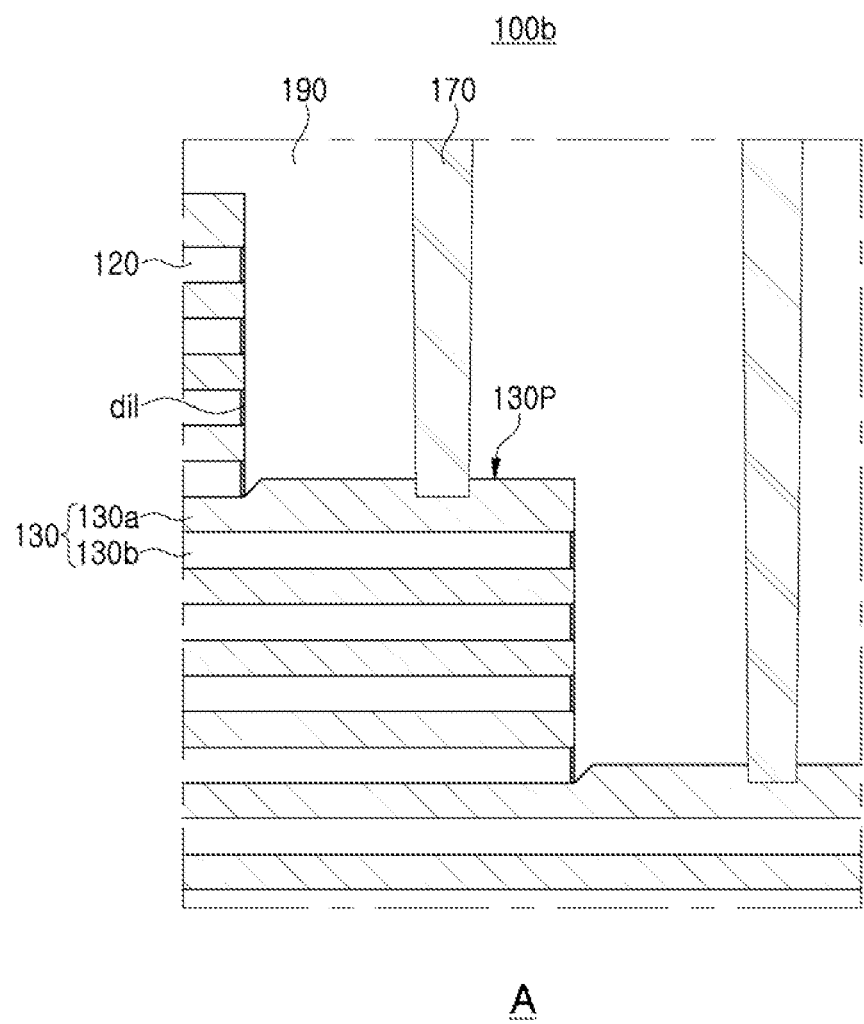
FIG. 5 is a schematic partially enlarged view of a semiconductor device according to an example embodiment.

FIG. 5 is a schematic partially enlarged view of a semiconductor device according to an example embodiment. In FIG. 5, a region responding to region 'A' of FIG. 2A is enlarged and illustrated. Referring to FIG. 5, unlike the exemplary embodiments of FIGS. 1 to 3, in a semiconductor device 100b, the gate electrodes 130 may not include a gate protrusion portion 130R. Accordingly, side surfaces of the gate electrodes 130 and side surfaces of the interlayer insulating layers 120, adjacent to each other, may be substantially coplanar.

Figure 6:
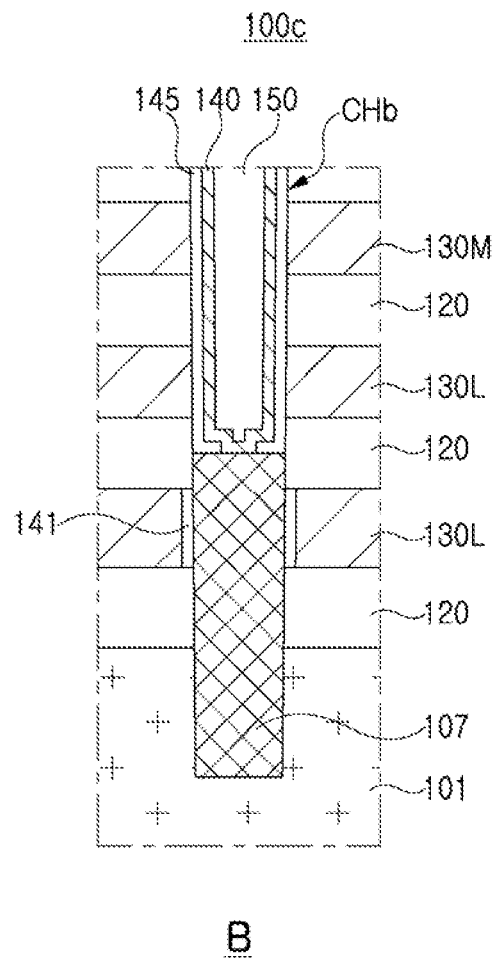
FIG. 6 is a schematic partially enlarged view of a semiconductor device according to an example embodiment.

FIG. 6 is a schematic partially enlarged view of a semiconductor device according to an example embodiment. In FIG. 6, a region corresponding to region 'B' of FIG. 2B is enlarged and illustrated. Referring to FIG. 6, unlike the example embodiments of FIGS. 1 to 3, the semiconductor device 100c may not include first and second planar conductive layers 102 and 104 on the plate layer 101. In addition, the channel structure CHb may further include an epitaxial layer 107.

The epitaxial layer 107 may be disposed on the plate layer 101 at a lower end of the channel structure CHb and may be disposed on a side surface of at least one gate electrode 130. The epitaxial layer 107 may be disposed in a recessed region of the plate layer 101. A height of a lower surface of the epitaxial layer 107 may be higher than an upper surface of a lowermost lower gate electrode 130L and lower than a lower surface of the lower gate electrode 130L thereabove. The epitaxial layer 107 may be connected to the channel layer 140 through an upper surface thereof. A gate insulating layer 141 may be further disposed between the lower gate electrode 130L in contact with the epitaxial layer 107.

Figure 7:
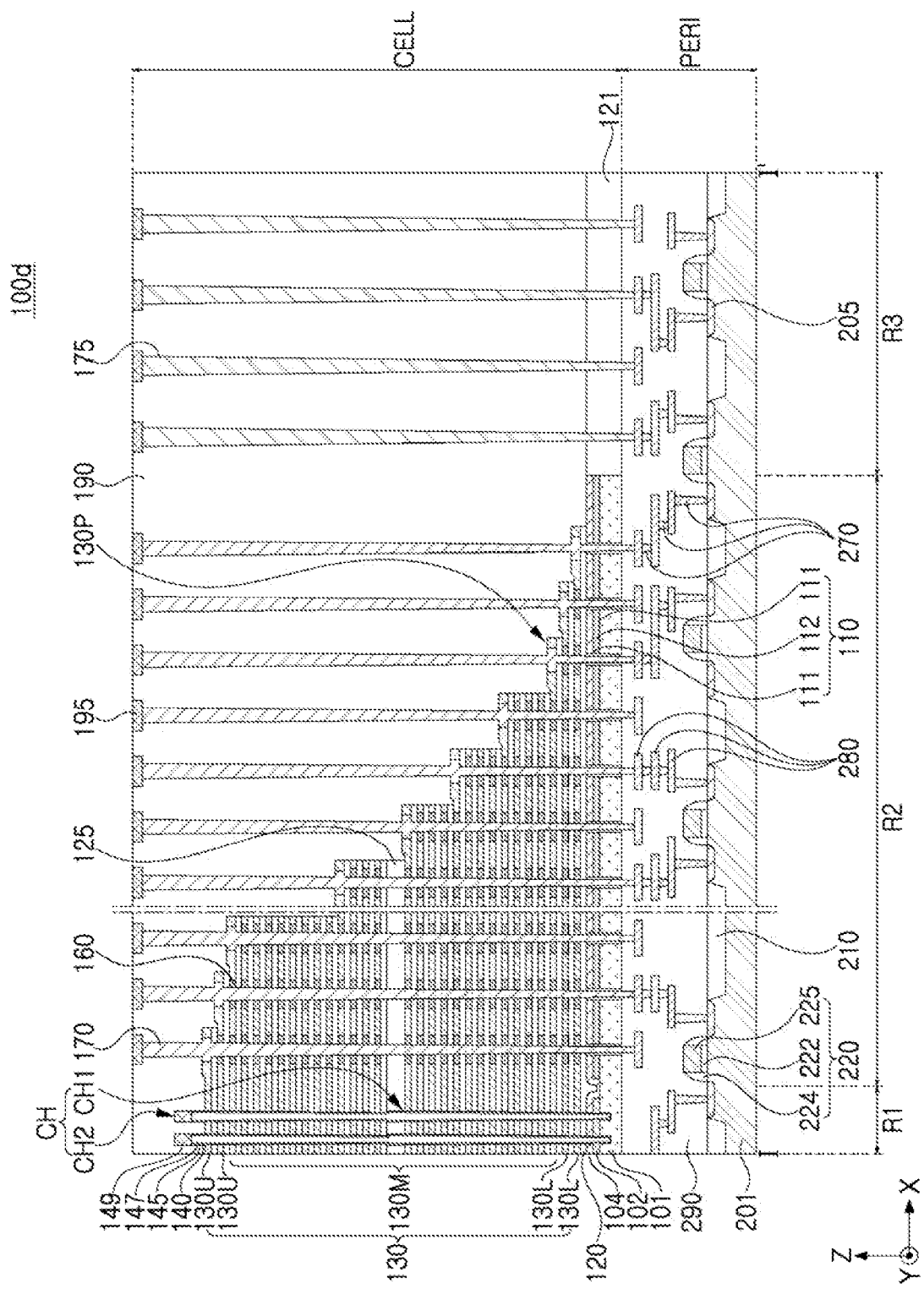
FIG. 7 is a schematic cross-sectional view of a semiconductor device according to an example embodiment.

FIG. 7 is a schematic cross-sectional view of a semiconductor device according to an example embodiment. Referring to FIG. 7, unlike the example embodiments of FIGS. 1 to 3, in a semiconductor device 100d, gate contacts 170 may penetrate through uppermost gate electrodes 130 and contact plug insulating layers 160 therebelow in the second region R2 and may be connected to pad regions 130P of the gate electrode 130. The gate contacts 170 may be disposed to penetrate through at least a portion of the cell region insulating layer 190 and to be connected to each of the pad regions 130P of the gate electrodes 130 exposed upwardly. The gate contacts 170 may penetrate through a plate layer 101, a second planar conductive layer 104, and a planar insulating layer 110 below the gate electrodes 130, to be connected to circuit interconnection lines 280 in the peripheral circuit region PERI. The gate contacts 170 may be spaced apart from the plate layer 101, the second planar conductive layer 104, and the planar insulating layer 110 by a substrate insulating layer 121. However, in some example embodiments, the gate contacts 170 may not extend into the peripheral circuit region PERI, and a lower end of the peripheral circuit region PERI may be located in the substrate insulating layer 121.

The gate contacts 170 may include, for example, at least one of tungsten (W), copper (Cu), aluminum (Al), and an alloy thereof. In an example embodiment of the present inventive concept, the gate contacts 170 may further include barrier layers on sidewalls and bottom surfaces of contact holes in which the gate contacts 170 are disposed. The barrier layer may include, for example, at least one of titanium (Ti), titanium nitride (TiN), tantalum (Ta), and tantalum nitride (TaN).

The contact plug insulating layers 160 may surround the gate contacts 170 while being alternately disposed with the interlayer insulating layers 120. The contact plug insulating layers 160 may be disposed to surround side surfaces of the gate contacts 170 below the pad regions 130P. Inner side surfaces of the contact plug insulating layers 160 may surround the gate contacts 170, and outer side surfaces of the contact plug insulating layers 160 may be surrounded by the gate electrodes 130. The gate contacts 170 may be physically and electrically connected to one gate electrode 130, and electrically separated from the gate electrodes 130 therebelow by the contact plug insulating layers 160.

The contact plug insulating layers 160 may include at least one of an insulating material, for example, silicon oxide, silicon nitride, and silicon oxynitride. Unlike the example embodiments of FIGS. 1 to 3, the semiconductor device 100d of the present embodiment may further include an operation of forming openings penetrating through second preliminary pads 119P and the stack structure in a first direction, and penetrating through a plate layer 101 and extending further downwardly than the plate layer 101, followed by the operation of forming the second preliminary pads 119P, and an operation of forming gate contacts 170 filling at least a portion of the openings and being in contact with the gate electrodes 130, followed by the operation of forming the gate electrodes 130.

Figure 8:
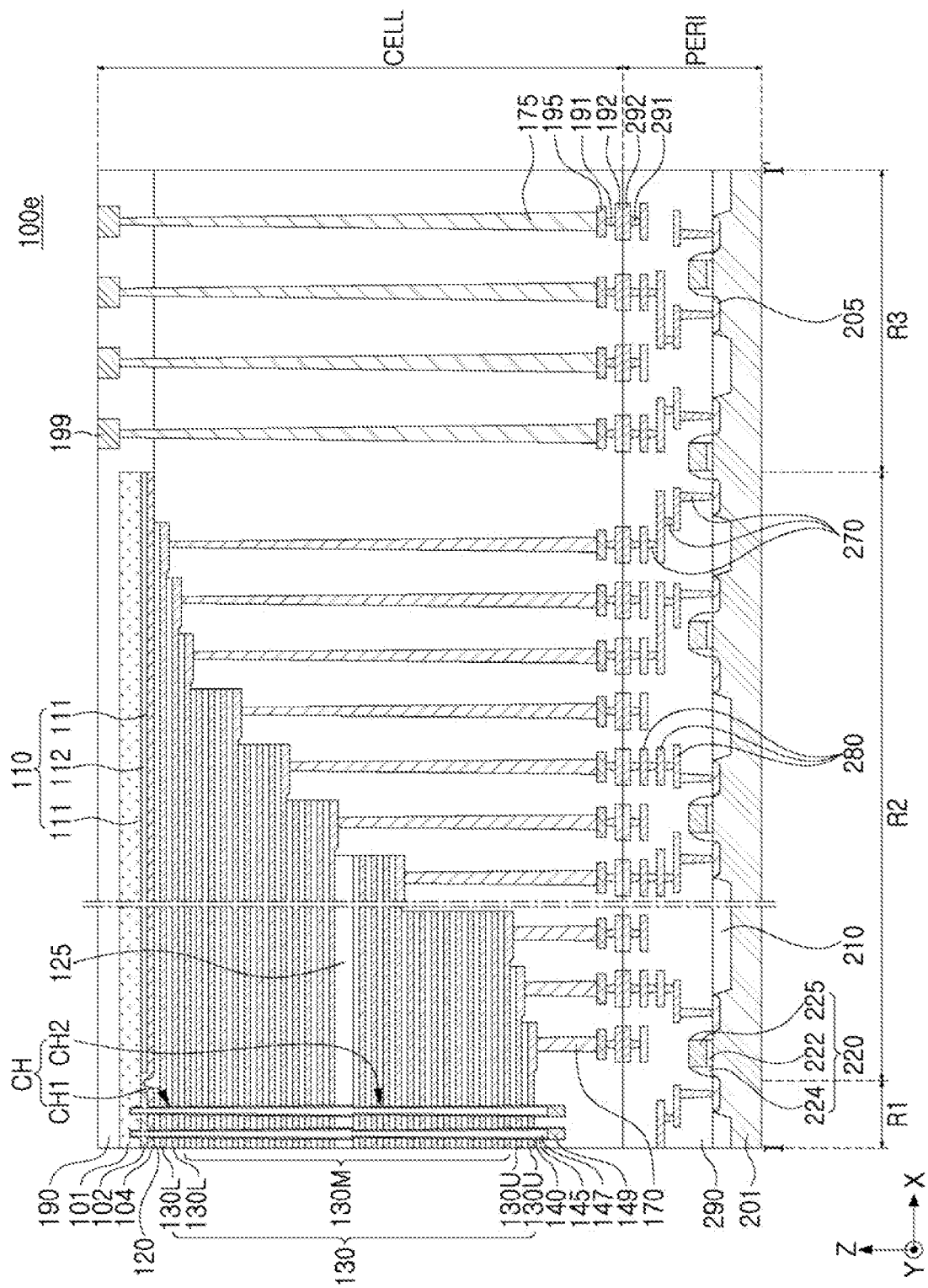
FIG. 8 is a schematic cross-sectional view of a semiconductor device according to an example embodiment.

FIG. 8 is a schematic cross-sectional view of a semiconductor device according to an example embodiment of the present inventive concept. Referring to FIG. 8, unlike the example embodiments of FIGS. 1 to 3, in a semiconductor device 100e, a memory cell region CELL may further include upper bonding structures including upper bonding via 191 and upper bonding pad 192 and a peripheral circuit region PERI may further include lower bonding structures including lower bonding via 291 and lower bonding pad 292.

The lower bonding structures including lower bonding via 291 and lower bonding pad 292 may be connected to circuit interconnection lines 280. The lower bonding structures including lower bonding via 291 and lower bonding pad 292 may be connected to the upper bonding structures including upper bonding via 191 and upper bonding pad 192. The lower bonding structures including lower bonding via 291 and lower bonding pad 292 may include a lower bonding via 291 and a lower bonding pad 292, which is a bonding layer. The lower bonding pad 292 may be disposed on the lower bonding via 291. The lower bonding structures including lower bonding via 291 and lower bonding pad 292 may include a conductive material, for example, tungsten (W), copper (Cu), aluminum (Al), or the like, and each of the components may also further include a diffusion barrier layer. The lower bonding structures including lower bonding via 291 and lower bonding pad 292 may provide an electrical connection path between the peripheral circuit region PERI and the memory cell region CELL, together with the upper bonding structures including upper bonding via 191 and upper bonding pad 192.

The upper bonding structures including upper bonding via 191 and upper bonding pad 192 may be connected to a cell interconnection line 195, The upper bonding structures including upper bonding via 191 and upper bonding pad 192 may be connected to the lower bonding structures including lower bonding via 291 and lower bonding pad 292. The upper bonding structures including upper bonding via 191 and upper bonding pad 192 may include an upper bonding via 191 and an upper bonding pad 192, which is a bonding layer. The upper bonding pad 192 may be disposed below the upper bonding via 191. The upper bonding structures including upper bonding via 191 and upper bonding pad 192 may include a conductive material, for example, tungsten (W), copper (Cu), aluminum (Al), or the like, and each of the components may also further include a diffusion barrier layer.

After forming a first semiconductor structure including a peripheral circuit region PERI and a second semiconductor structure including a memory cell region CELL, the semiconductor device 100e of the present embodiment may be manufactured through an operation of bonding the first semiconductor structure and the second semiconductor structure.

Figure 9:
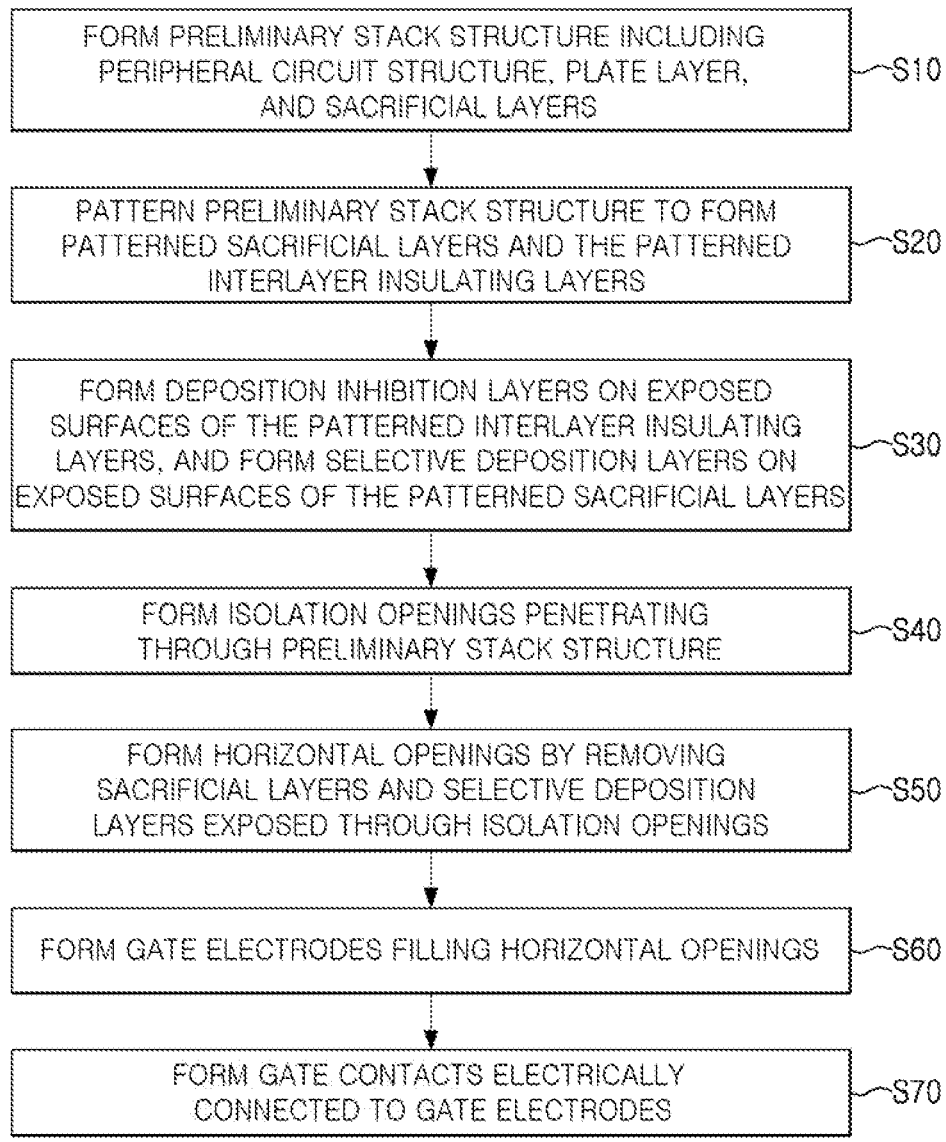
FIG. 9 is a flowchart illustrating a sequence of a method of manufacturing a semiconductor device according to an example embodiment.

FIG. 9 is a flowchart illustrating a method of manufacturing a sequence of a semiconductor device according to an example embodiment of the present inventive concept, FIGS. 9 to 17B are schematic cross-sectional views and partially enlarged views for illustrating a method of manufacturing semiconductor device according to an example embodiment. FIGS. 11B, 12B, 15B, 16B, and 17B illustrate enlarged regions 'A' of FIGS. 11A, 12A, 15A, 16A, and 17A, respectively.

Figure 10:
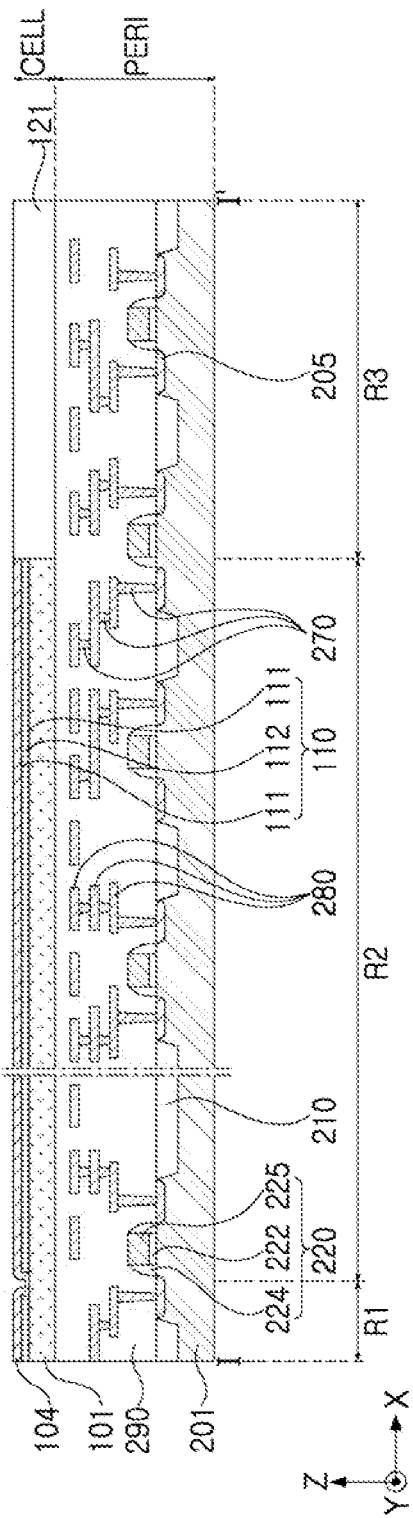
FIGS. 10 to 17B are schematic cross-sectional views and partially enlarged views for illustrating a method of manufacturing a semiconductor device according to an example embodiment.

Referring to FIGS. 9 and 10, a peripheral circuit region PERI including circuit elements 220 and lower interconnection structures may be formed on a substrate 201, a plate layer 101, a planar insulating layer 110, a second planar conductive layer 104, and a substrate insulating layer 121, provided with a memory cell region CELL, may be formed above the peripheral circuit region PERI.

First, device isolation layers 210 may be formed in the substrate 201, and then a circuit gate dielectric layer 222 and a circuit gate electrode 225 may be sequentially formed on the substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer. Next, a spacer layer 224 and source/drain regions 205 may be formed on both sidewalls of the circuit gate dielectric layer 222 and the circuit gate electrode 225. According to example embodiments, the spacer layer 224 may include a plurality of layers. Next, the source/drain regions 205 may be formed by performing an ion implantation process.

Among the lower interconnection structures, circuit contact plugs 270 may be formed by forming a portion of a peripheral region insulating layer 290, and then removing the portion thereof and removing the same and filling a conductive material. Circuit interconnection lines 280 may be formed by, for example, depositing a conductive material and then patterning the same.

The peripheral region insulating layer 290 may be formed of a plurality of insulating layers. A portion of the peripheral region insulating layer 290 may be formed in respective steps of forming the lower interconnection structures and forming the other portion thereof above the uppermost circuit interconnection line 280, so that the peripheral region insulating layer 290 may be finally formed to cover the circuit elements 220 and the lower interconnection structures.

Next, the plate layer 101 may be formed on the peripheral region insulating layer 290. The plate layer 101 may be made of, for example, polycrystalline silicon and may be formed by a CVD process. Polycrystalline silicon constituting the plate layer 101 may include impurities.

The first and second planar insulating layers 111 and 112 constituting the planar insulating layer 110 may be alternately stacked on the plate layer 101. A portion of the planar insulating layer 110 may be replaced with the first planar conductive layer 102 of FIG. 2A through a subsequent process. The first planar insulating layers 111 may include a material, different from that of the second planar insulating layer 112. For example, the first planar insulating layers 111 may be formed of the same material as the interlayer insulating layers 120, and the second planar insulating layer 112 may be formed of the same material as the subsequent sacrificial layers 118. A portion of the planar insulating layer 110 may be removed by a patterning process, for in a portion of regions, for example, in the second region R2 of the plate layer 101.

The second planar conductive layer 104 may be formed on the planar insulating layer 110 and may be in contact with the plate layer 101 in a region in which the planar insulating layer 110 is removed. Accordingly, the second planar conductive layer 104 may be bent along end portions of the planar insulating layer 110 and may cover the end portions and extend onto the plate layer 101.

A substrate insulating layer 121 may be formed to penetrate through the plate layer 101 in a third region R3. The substrate insulating layer 121 may be formed by removing a portion of the plate layer 101, the planar insulating layer 110, and the second planar conductive layer 104, and then filling the same with an insulating material. After insulating material is filled, a planarization process may be further performed using a chemical mechanical polishing (CMP) process. Accordingly, an upper surface of the substrate insulating layer 121 may be substantially coplanar with an upper surface of the second planar conductive layer 104.

Figure 11A:
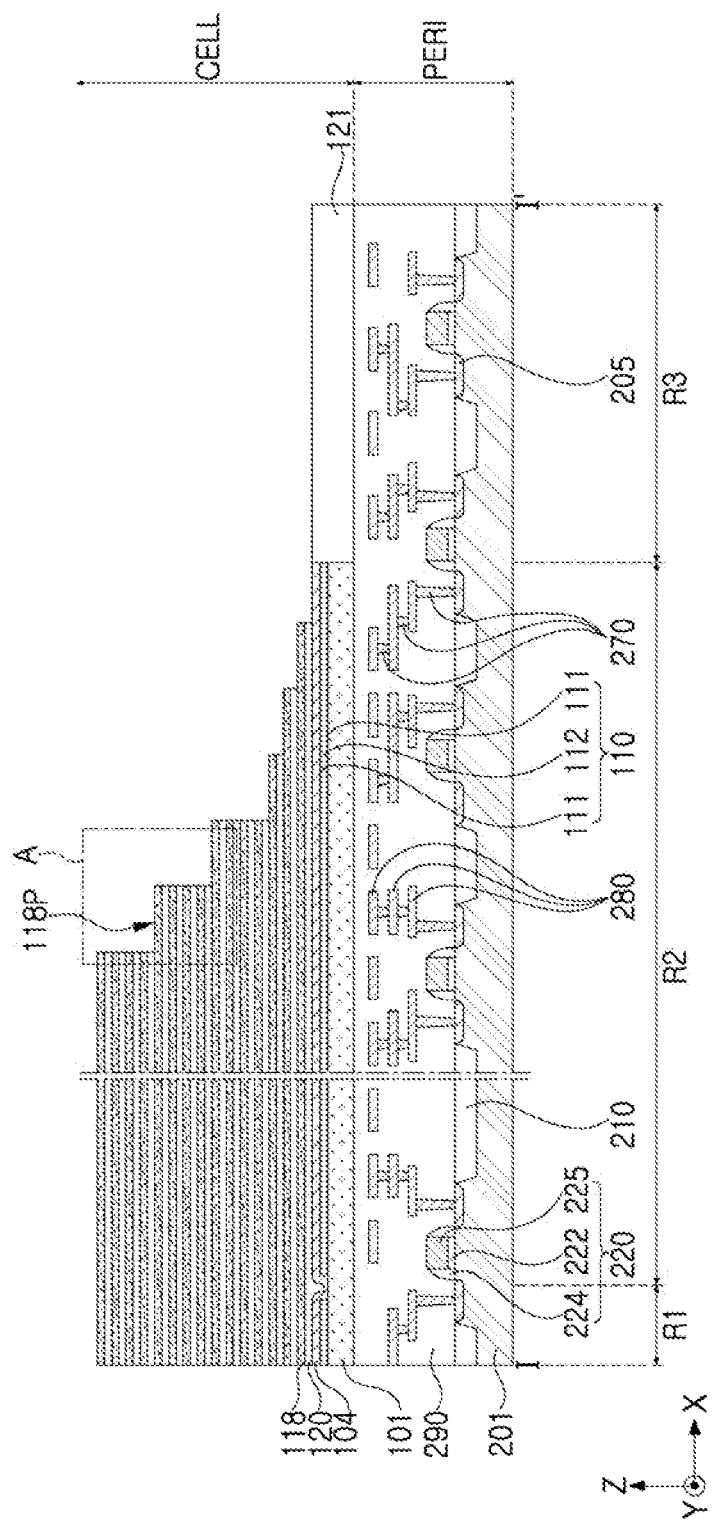
Figure 11B:
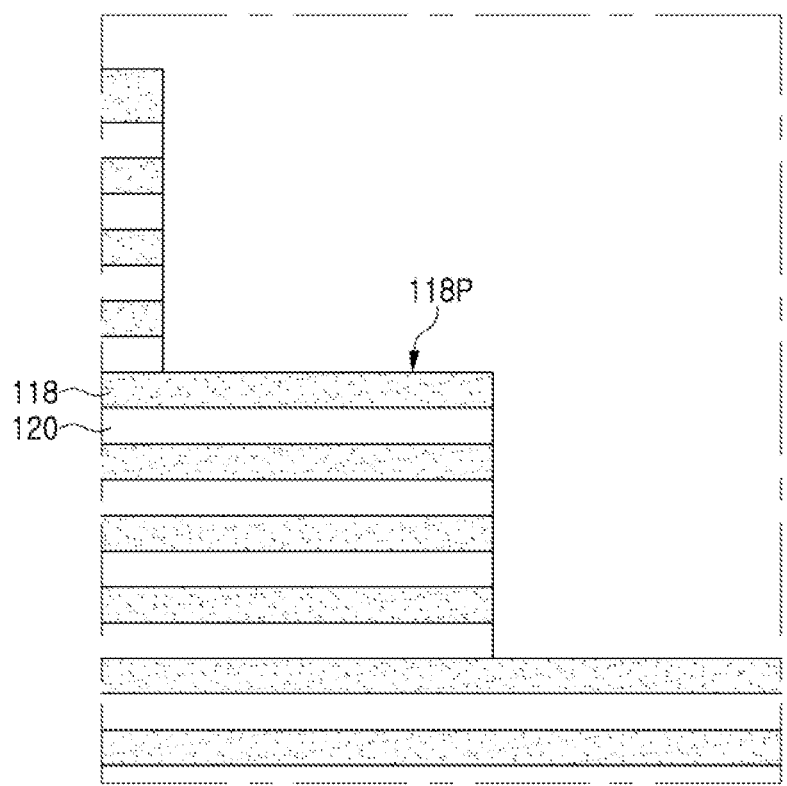
Figure 12A:
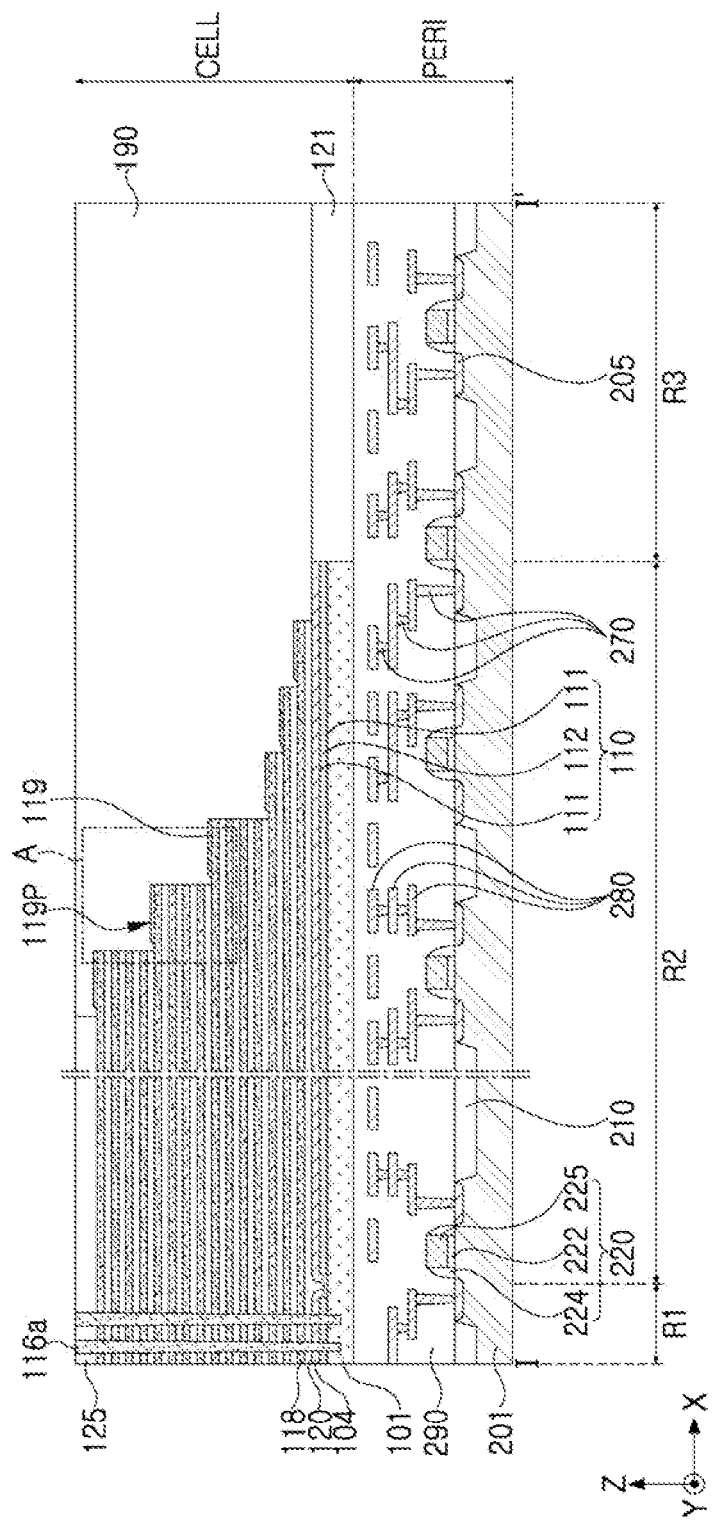
Figure 12B:
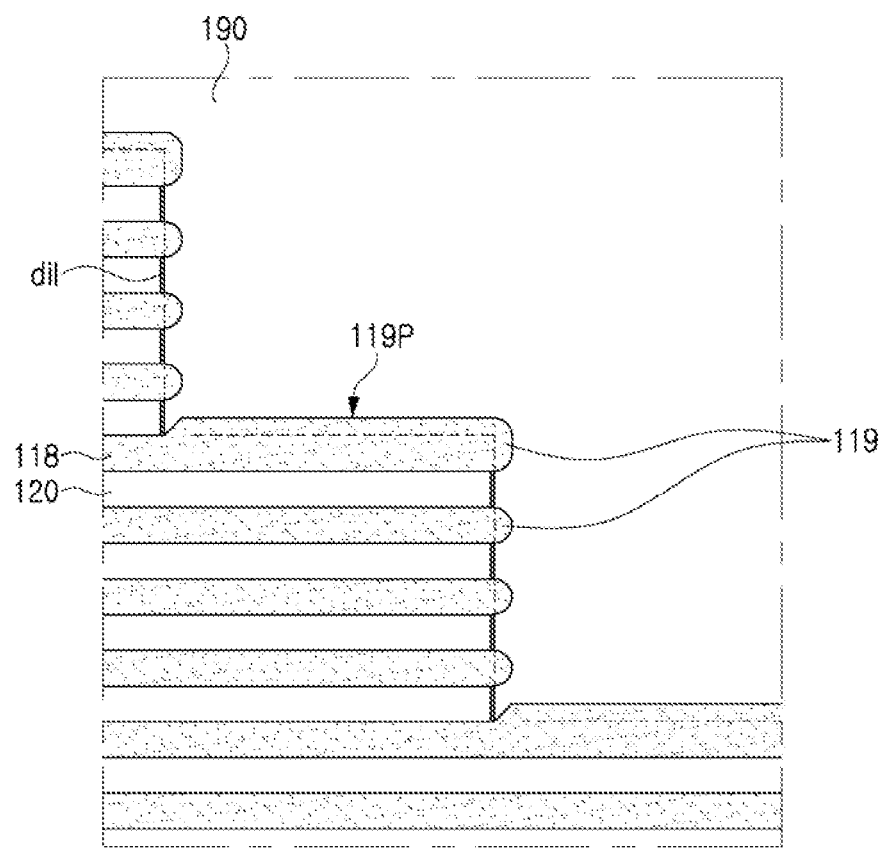
Figure 12C:
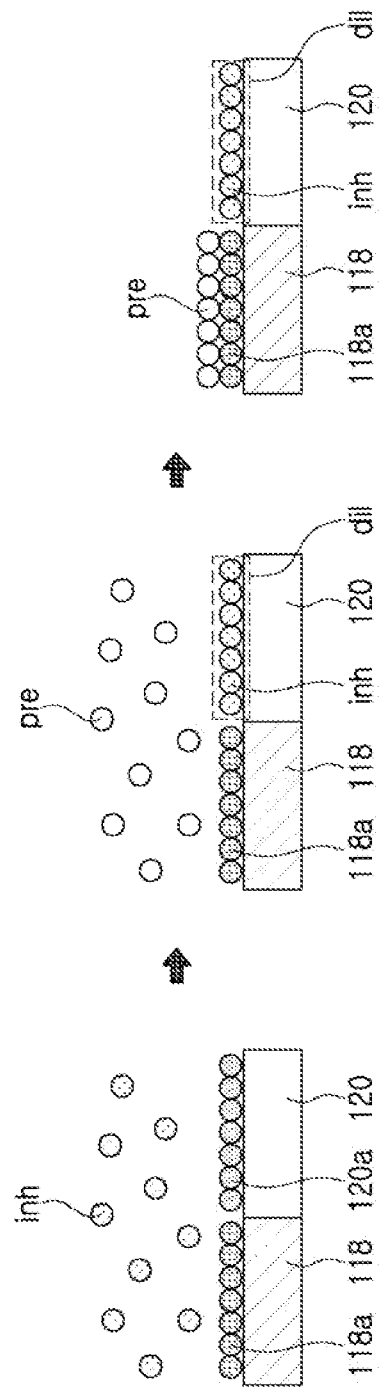

Referring to FIGS. 9, 11A, and 11B, a preliminary stack structure may be formed by alternately stacking sacrificial layers 118 and interlayer insulating layers 120 constituting a lower stack structure on the second planar conductive layer 104 (S10), and the preliminary stack structure may be patterned to form a stepped structure, so that the patterned sacrificial layers 118 and patterned interlayer insulating layers 120 may be formed (S20). First, a stack structure may be formed by alternately stacking the sacrificial layers 118 and the interlayer insulating layers 120 on the second planar conductive layer 104. In this step, the sacrificial layers 118 and the interlayer insulating layers 120 may be formed in a height region in which first channel structures CH1 (see FIG. 2) are disposed. An upper interlayer insulating layer 125 having a relatively thick thickness may be formed on the uppermost portion, and an etch stop layer 126 may be formed thereabove.

The sacrificial layers 118 may be replaced with the gate electrodes 130 (see FIG. 2) through a subsequent process. The sacrificial layers 118 may be formed of a material, different from that of the interlayer insulating layers 120, and may be formed of a material that may be etched with etch selectivity with respect to the interlayer insulating layers 120 under specific etching conditions. For example, the interlayer insulating layer 120 and the upper interlayer insulating layer 125 may be formed of at least one of silicon oxide and silicon nitride, and the sacrificial layers 118 may be formed of a material, different from that of the interlayer insulating layer 120 including silicon, silicon oxide, silicon carbide, or silicon nitride. In example embodiments, the interlayer insulating layers 120 may not all have the same thickness. In addition, the thicknesses of the interlayer insulating layers 120 and the sacrificial layers 118 and the number of films constituting the layers may be variously changed from those shown. The etch stop layer 126 may be a layer for protecting a lower structure when forming a stepped structure, and may also be referred to as a hard mask layer.

Next, a photolithography process and an etching process may be repeatedly performed on sacrificial layers 118 using a mask layer, so that the upper sacrificial layers 118 extend shorter than the lower sacrificial layers 118 in the second region R2. Accordingly, the sacrificial layers 118 may form a staircase stricture in predetermined units, and first preliminary pads 118P, positioned in an uppermost portion of the sacrificial layers 118 may be exposed upwardly.

Referring to FIGS. 9, 12A, 12B, and 12C, a deposition inhibition layer (dil) may be formed on exposed surfaces of the patterned interlayer insulating layers 120 through a selective deposition process, and a selective deposition layer 119 may be formed on exposed surfaces of the patterned sacrificial layers 118.

First, a deposition inhibition layer (dil) may be formed on exposed surfaces of the interlayer insulating layers 120 by supplying an inhibitor (inh). The inhibitor (inh) may include nitrogen trifluoride ($NF_3$). A deposition inhibition layer (dil) may not be formed on the exposed surfaces of the sacrificial layers 118. This may be due to the fact that elements included in the inhibitor (inh) are friendly to the interlayer insulating layers 120, and not friendly to the sacrificial layers 118. For example, a fluorine element included in the inhibitor (inh) may be friendly to an oxygen element included in the interlayer insulating layers 120, and may not be friendly to a nitrogen element included in the sacrificial layers 118. The deposition inhibition layer (dil) may be formed by combining an element included in the inhibitor (inh) and an element present on a surface of the interlayer insulating lavers 120. For example, an oxygen element of the interlayer insulating layers 120 and a fluorine element of the inhibitor inh may be combined to form a deposition inhibition layer (dil). The deposition inhibition layer (dil) may be a monolayer containing a fluorine element.

Next, a selective deposition process may proceed. The selective deposition process may be performed through an atomic layer deposition (ALD) process. The ALD process may proceed by supplying a precursor (pre) and then supplying a reactant. Such an ALD process may be performed one or more times. First, a precursor (pre) may be supplied, and the precursor (pre) may be adsorbed on exposed surfaces of the sacrificial layers 118. The precursor (pre) may not be adsorbed on exposed surfaces of the interlayer insulating layers 120. This may be due to the fact that the deposition inhibition layer (dil) prevents the adsorption of the precursor (pre). The precursor (pre) may be a halogen-substituted silane-based silicon precursor such as hexachlorodisilane (HCD), dichlorosilane (DCS), trichlorosilane (TCS: $SiCl3H$), tetrachlorosilane (TCS: $SiCl4$), and the like. Next, by supplying a reactant, the reactant may combine with the precursors adsorbed on the exposed surfaces of the sacrificial layers 118. Accordingly, the selective deposition layer 119 may be formed on the exposed surfaces of the sacrificial layers 118. Through this selective deposition process, a selective deposition layer 119 may be formed only on the exposed surfaces of the sacrificial layers 118, thereby forming second preliminary pads 119P on the first preliminary pads 118P.

According to example embodiments, after the selective deposition process, an annealing process or a plasma nitridation process may be performed. Accordingly, density of the selective deposition layer 119 may be increased and resistance to chemicals may be increased. Next, a portion of cell region insulating layers 190 covering the lower stack structure of the sacrificial layers 118 and the interlayer insulating layers 120 may be formed.

Next, first channel sacrificial layers 116a may be formed in a region corresponding to the first channel structures CH1 (see FIG. 2A) in the first region R1. The first channel sacrificial layers 116a may be formed by forming lower channel holes to penetrate through the lower stack structure, and then depositing a material forming the first channel sacrificial layers 116a on the lower channel holes. The first channel sacrificial layers 116a may include, for example, polycrystalline silicon.

Figure 13:
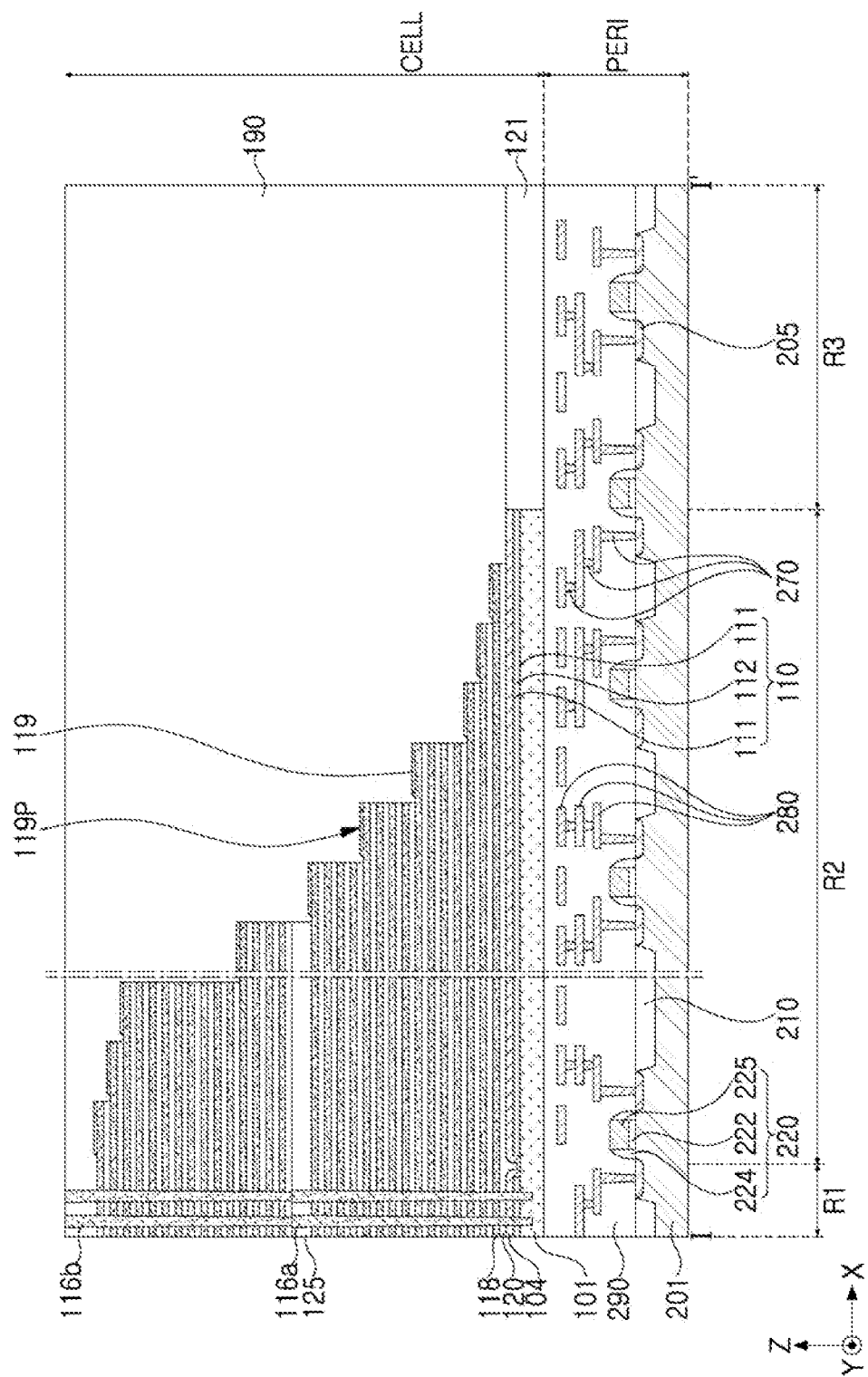

Referring to FIG. 13, second channel sacrificial layers 116b penetrating through the upper stack structure may be formed. First, a portion of a cell region insulating layer 190 covering the upper stack structure of the sacrificial layers 118 and the interlayer insulating layers 120 may be formed. Next, above first channel sacrificial layers 116a, second channel sacrificial layers 116b may be formed by forming upper channel holes so as to pass upper ends of the first channel sacrificial layers 116 are exposed through the upper stack structure, and then depositing a material forming the second channel sacrificial layers 116b in the upper channel holes. The second channel sacrificial layers 116b may include, for example, polycrystalline silicon.

Figure 14:
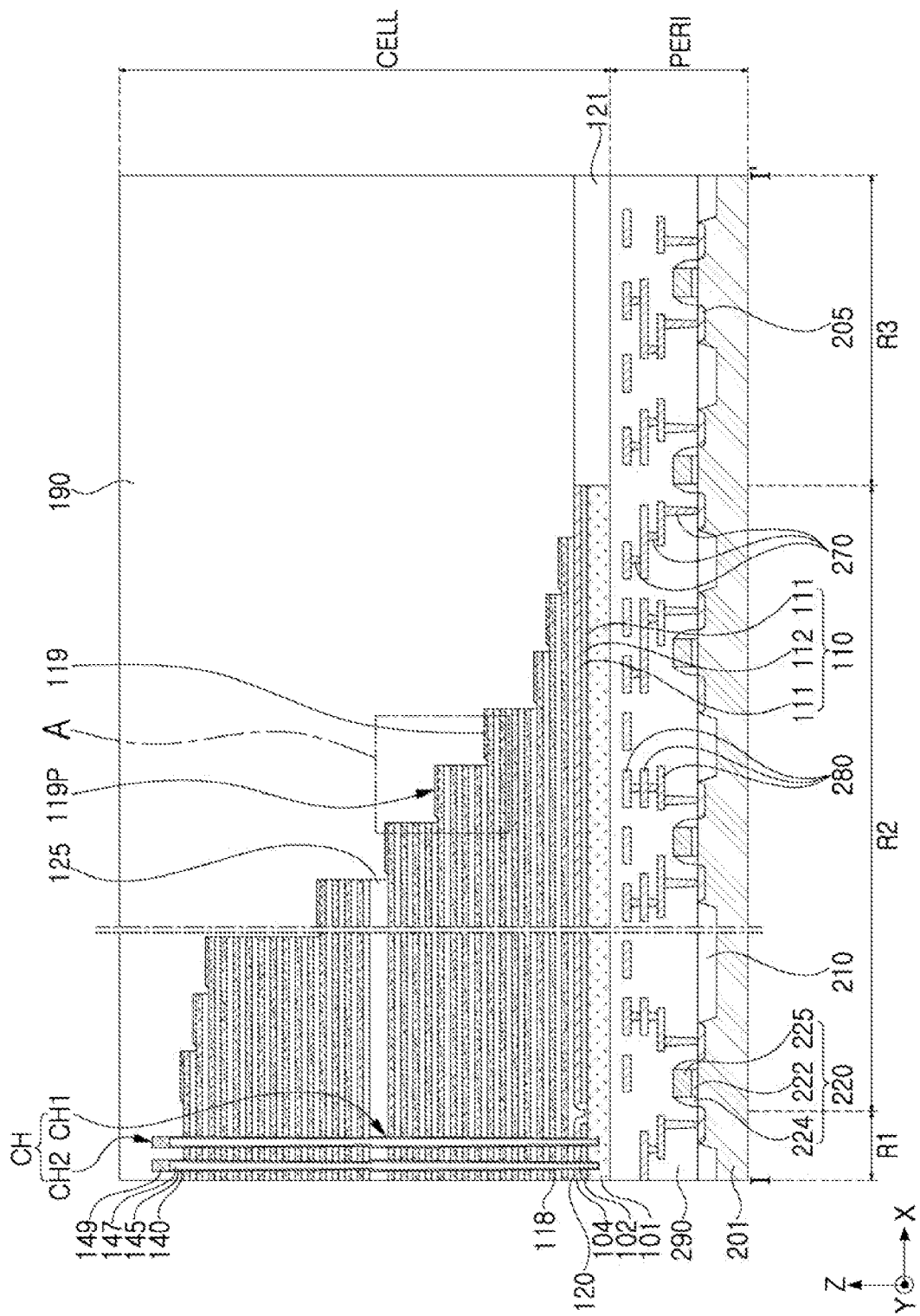

Referring to FIG. 14, the first and second sacrificial channel layers 116a and 116b may be removed to form channel structures CH. First, an upper isolation region SS (see FIG. 2B) may be formed by removing portions of sacrificial layers 118 and interlayer insulating layers 120 in the upper stack structure. In order to form the upper isolation region SS, a region in which the upper isolation region SS is to be formed may be exposed using a separate mask layer, a predetermined number of sacrificial layers 118 and interlayer insulating layers 120 may be removed from the top, and then an insulating material may be deposited to form an upper isolation insulating layer 103 (see FIG. 2B).

Channel structures CH may be formed by removing the first and second sacrificial channel layers 116a and 116b to form channel holes, and then filling the channel holes therein. Specifically, the channel structures CH may be formed by sequentially forming a gate dielectric layer 145, a channel layer 140, a channel filling insulating layer 147, and a channel pad 149 in the channel holes. In the present step, at least a portion of the gate dielectric layer 145 extending vertically along the channel layer 140 may be formed. The channel layer 140 may be formed on the gate dielectric layer 145 within the channel structures CH. The channel filling insulating layer 147 is formed to fill the channel structures CH, and may be an insulating material. The channel pads 155 may be formed of a conductive material, for example polycrystalline silicon.

Figure 15A:
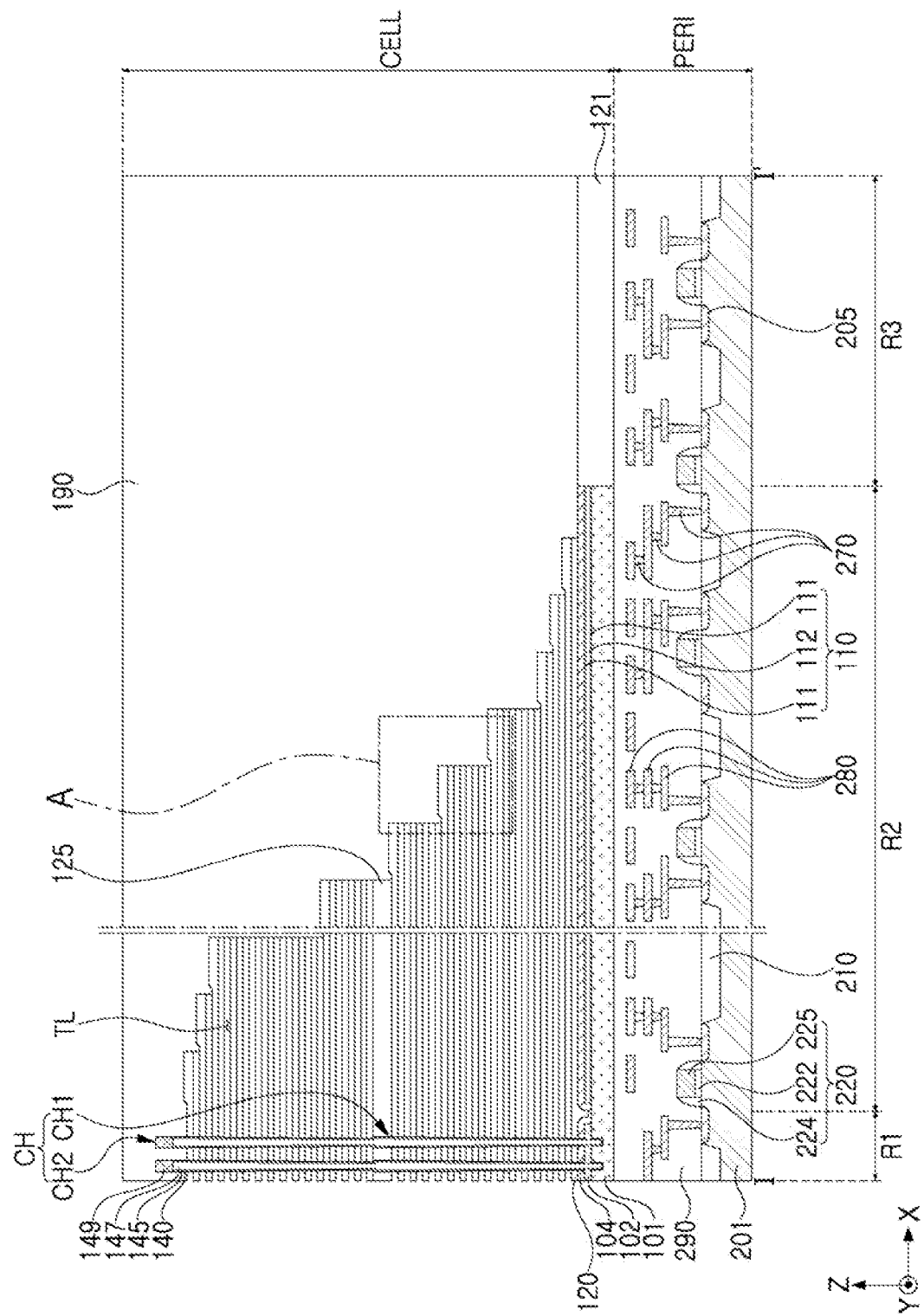
Figure 15B:
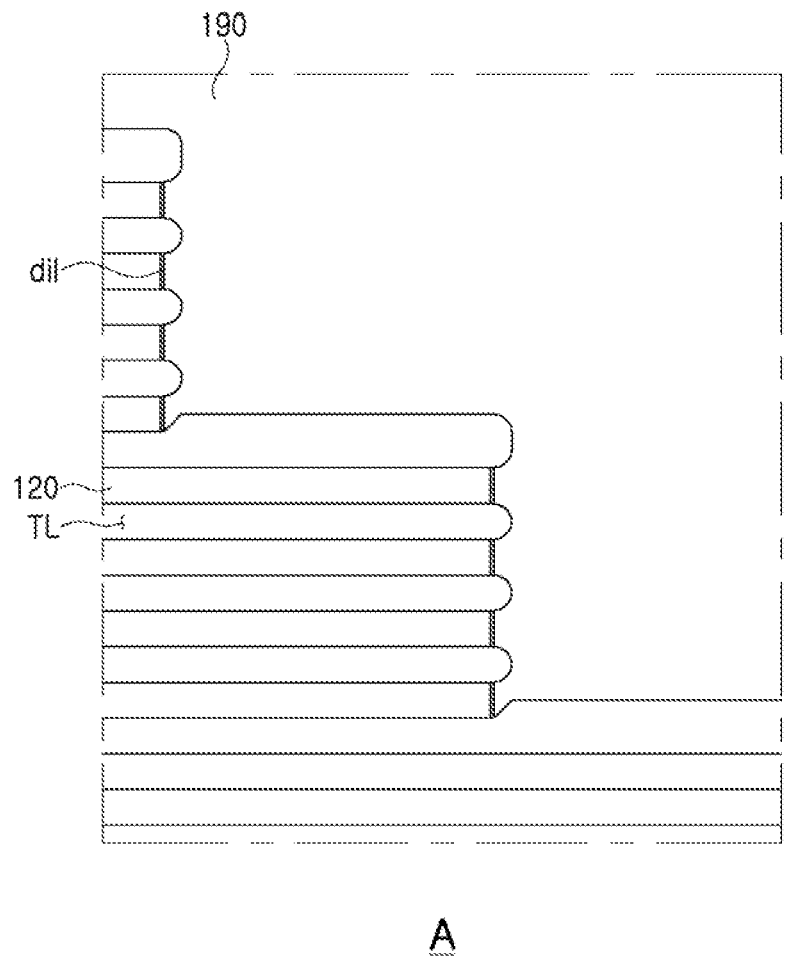

Referring to FIGS. 9, 15A, and 15B, an isolation opening penetrating a preliminary stack structure may be formed (S40), and sacrificial layers 118 and selective deposition layers 119 exposed through the isolation opening may be removed to form horizontal opening (S50). First, isolation openings extending to the plate layer 101 through the sacrificial layers 118 and the interlayer insulating layers 120 may be formed at a position of the first and second isolation regions MS1 and MS2 (see FIG. 1).

Next, an etch-back process may be performed while forming separate sacrificial spacer layers in the isolation openings, to selectively remove a planar insulating layer 110 from a first region R1, and a portion of the exposed gate dielectric layer 145 may also be removed together. After forming a first planar conductive layer 102 by depositing a conductive material in a region from which the planar insulating layer 110 is removed, the sacrificial spacer layers may be removed in the isolation openings. By this process, a first planar conductive layer 102 may be formed in the first region R1.

Next, the sacrificial layers 118 and the selective deposition layers 119 may be selectively removed with respect to the interlayer insulating layers 120 using, for example, wet etching. Accordingly, horizontal openings TL may be formed between the interlayer insulating layers 120.

Figure 16A:
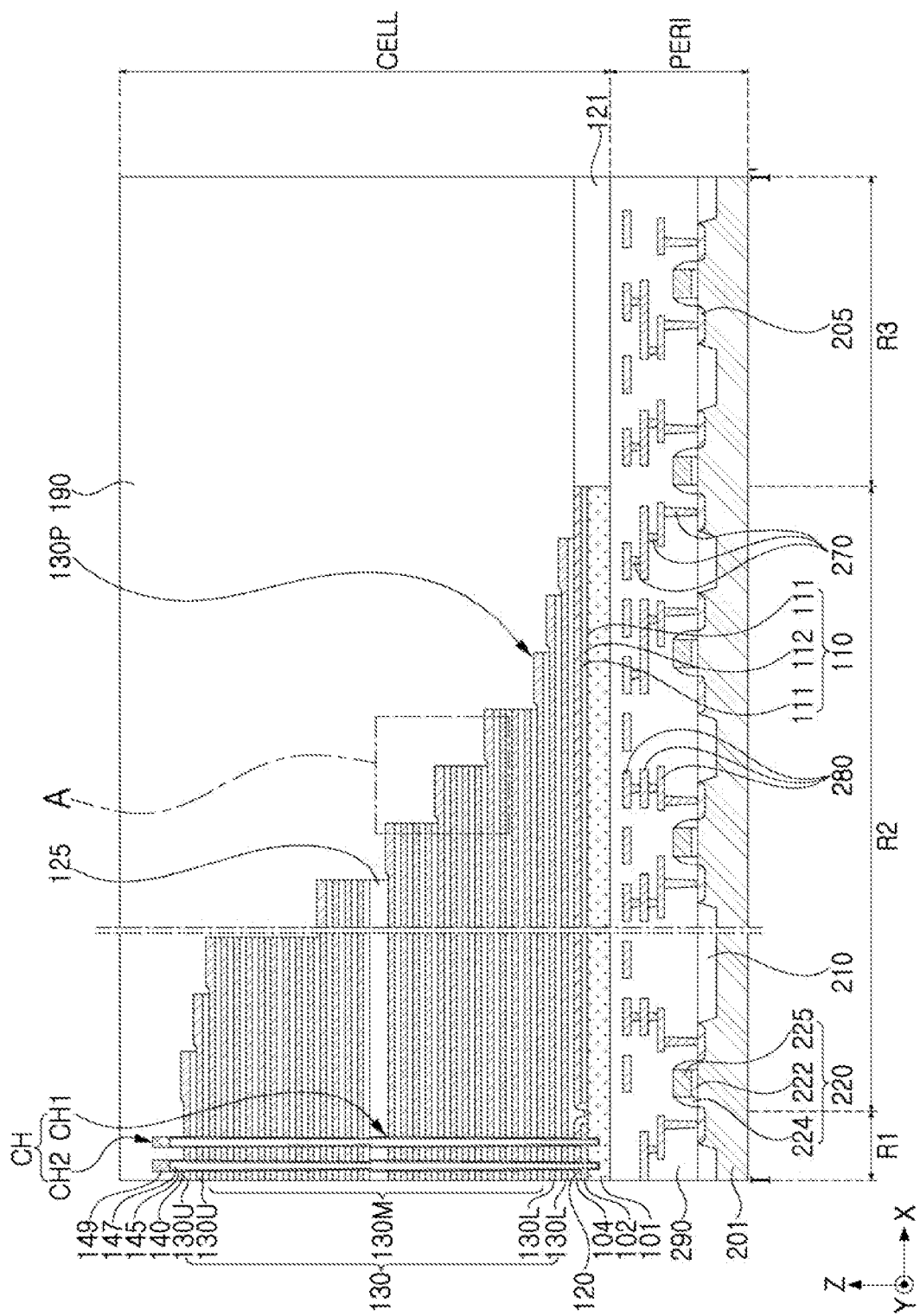
Figure 16B:
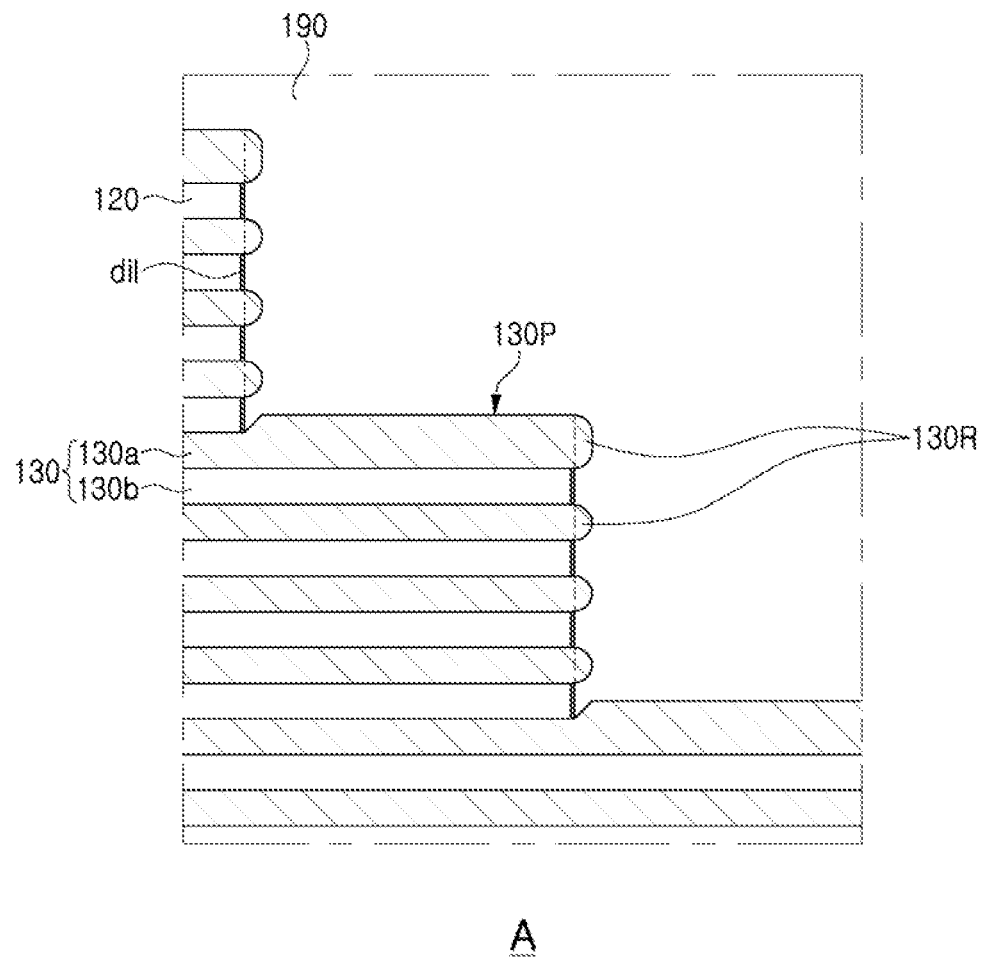

Referring to FIGS. 9, 16A, and 16B, gate electrodes 130 may be formed by filling the horizontal openings TL with a conductive material (S60). The conductive material constituting the gate electrodes 130 may fill the horizontal openings TL. The conductive material may include a metal, polycrystalline silicon or metal silicide material. After forming the gate electrodes 130, an isolation insulating layer 105 (see FIG. 2B) may be formed in the isolation openings formed in the first and second isolation regions MS1 and MS2.

Figure 17A:
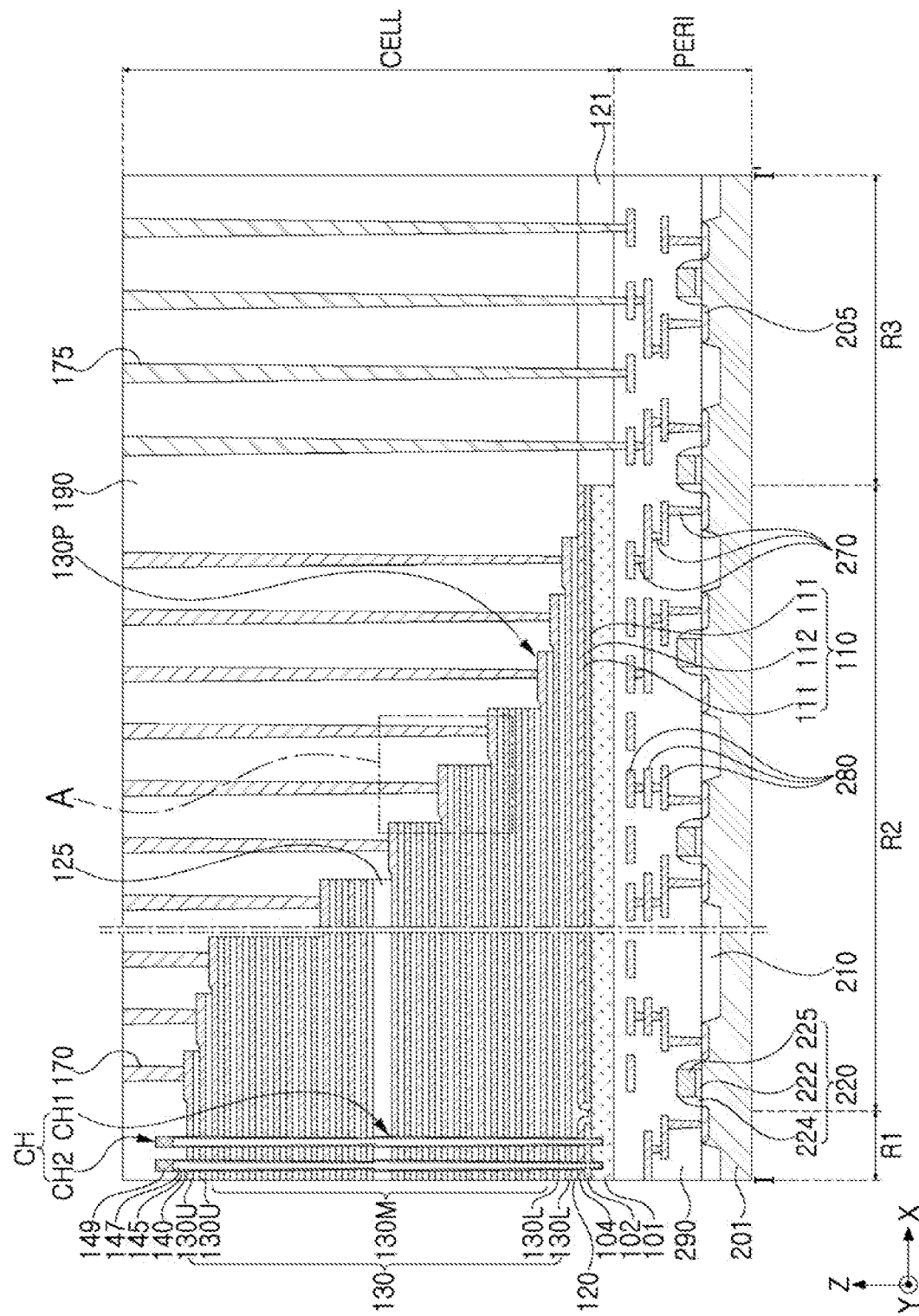
Figure 17B:
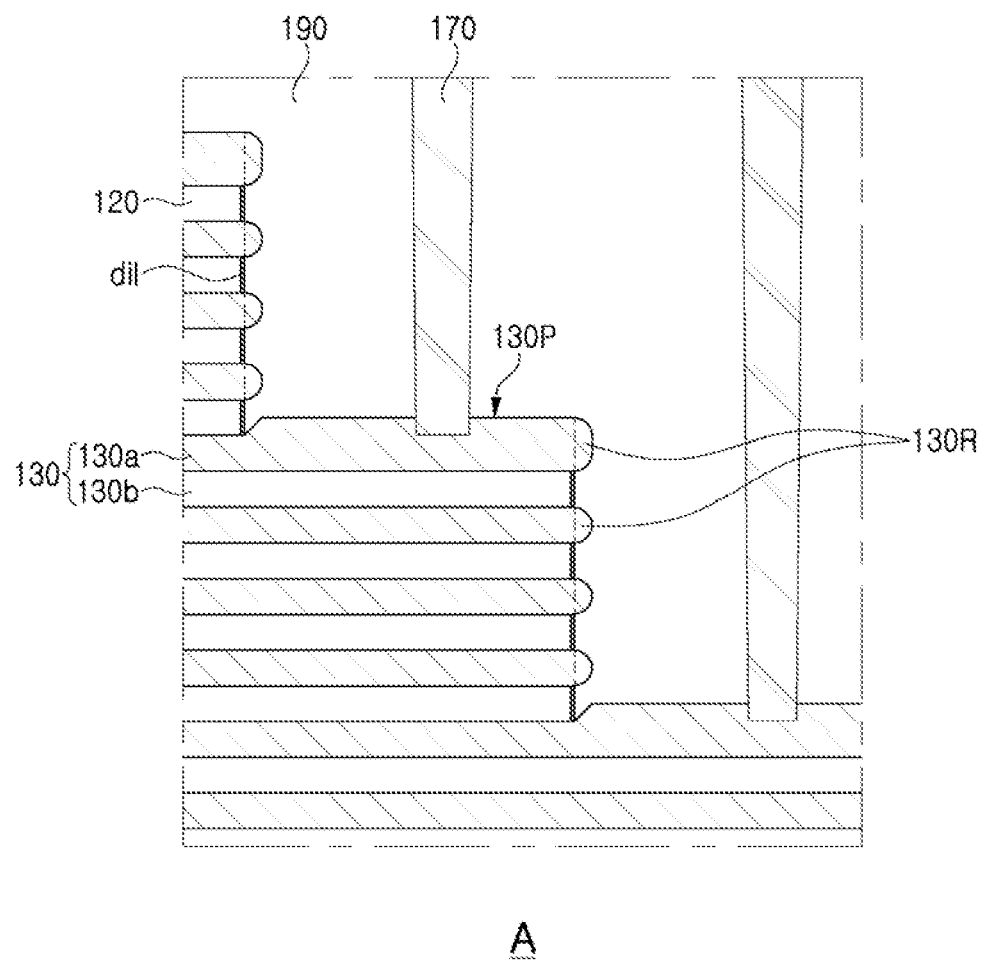

Referring to FIGS. 9, 17A, and 17B, gate contacts 170 electrically connected to the gate electrodes 130 may be formed (S70). The gate contacts 162 may be formed to be connected to the gate electrodes 130 in a second region R2. Next, referring to FIG. 2A, the semiconductor device 100 may be manufactured by forming cell interconnection lines 195 connected to upper ends of the gate contacts 170 and through plugs 175.

Figure 18:
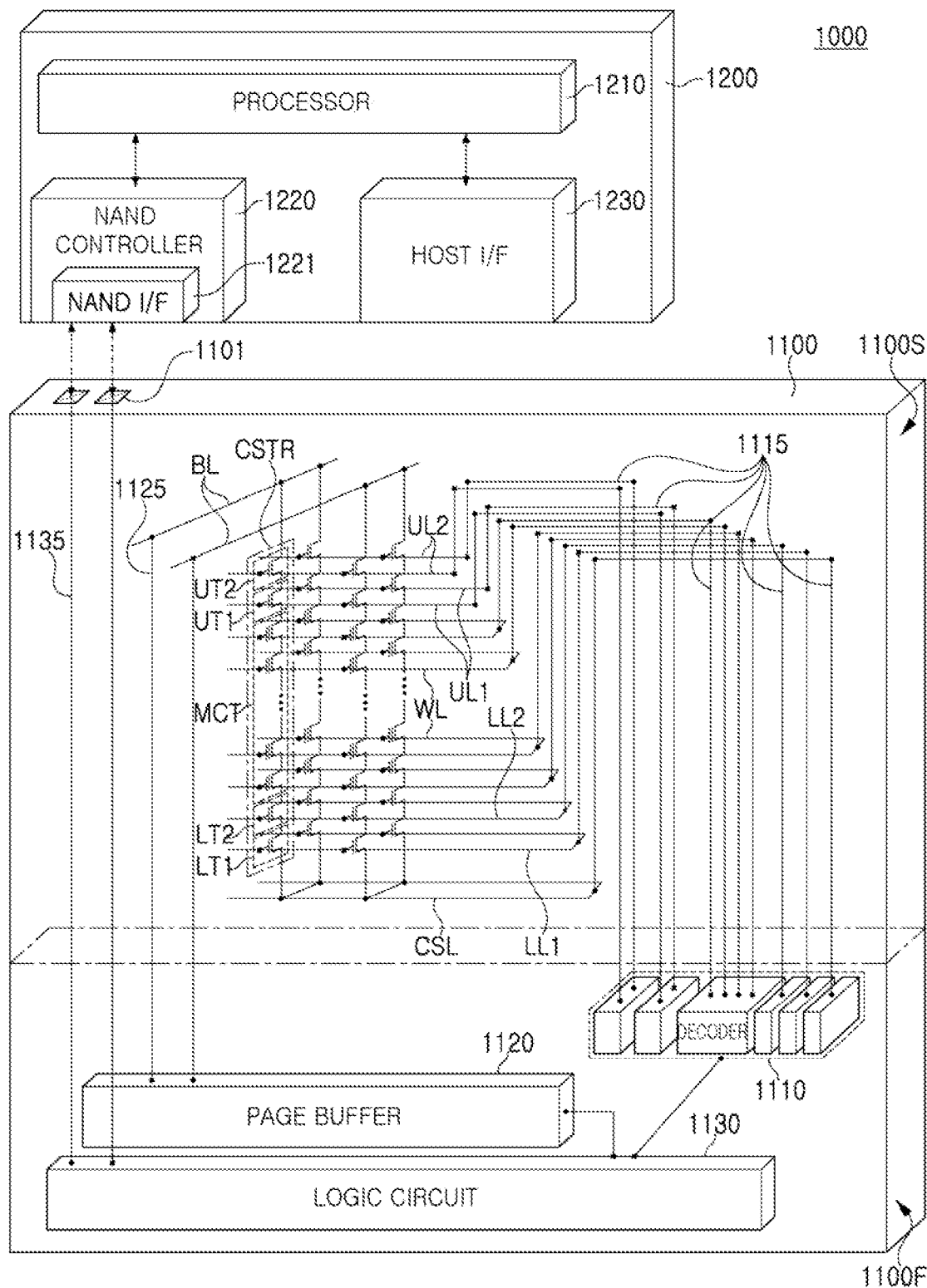
FIG. 18 is a diagram schematically illustrating an electronic system including a semiconductor device according to an example embodiment.

FIG. 18 is a diagram schematically illustrating an electronic system including a semiconductor device according to an example embodiment. Referring to FIG. 18, an electronic system 1000 may include a semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid state drive device (SSD) including one or a plurality of semiconductor devices 1100, a Universal Serial Bus (USB), a computing system, a medical device, or a communication device. According to example embodiments, the electronic system 1000 may be an electronic system storing data.

The semiconductor device 1100 may be a non-volatile memory device, and may be, for example, the NAND flash memory device described above with reference to FIGS. 1 to 3. The semiconductor device 1100 may include a first structure 1100F and a second structure 1100S on the first structure 1100F. According to example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, common source line CSL, word lines WL, first and second gate upper lines UL1 and UL2, first and second gate lower lines LL1 and LL2, and memory cell strings CSTR between the bit lines BL and the common source line CSL.

In the second structure 1100S, each of the memory cell strings CSTR may include lower transistors including LT1 and LT2, adjacent to the common source line CSL, upper transistors UT1 and UT2, adjacent to the bit lines BL, and a plurality of memory cell transistors MCT disposed between the lower transistors including LT1 and LT2 and the upper transistors UT1 and UT2. The number of lower transistors such as LT1 and LT2 and the number of upper transistors UT1 and UT2 may be variously modified according to example embodiments.

According to example embodiments, the upper transistors UT1 and UT2 may include string select transistors, and the lower transistors including LT1 and LT2 may include ground select transistors. The gate lower lines LL1 and LL2 may be gate electrodes of the lower transistors including LT1 and LT2, respectively. The word lines WL may be gate electrodes of the memory cell transistors MCT, and the gate upper lines UL1 and UL2 may be gate electrodes of the upper transistors UT1 and UT2, respectively.

According to example embodiments, the lower transistor LT1 may be a lower erase control transistor. According to example embodiments the lower transistor LT2 may be a ground select transistor. According to example embodiments, the lower transistors LT1 and LT2 may be connected in series. According to example embodiments, the upper transistor UT1 may be a string select transistor. According to example embodiments, the upper transistor UT2 may be an erase control transistor. According to example embodiments, the upper transistors UT1 and UT2 may be connected in series. At least one selected from the group consisting of LT1 and UT2 may be used for an erase operation of erasing data stored in the memory cell transistors MCT by using a GIDL phenomenon.

The common source line CSL, the first and second gate lower lines LL1 and LL2, the word lines WL, and the first and second gate upper lines UL1 and UL2 may be electrically connected to a decoder circuit 1110 through first connection interconnections 1115 extending from a first structure 1100F to a second structure 1100S. The bit lines BL may be electrically connected to a page buffer 1120 through second connection interconnections 1125 extending from the first structure 110F to the second structure 1100S.

In the first structure 1100F, the decoder circuit 1110 and the page buffer 1120 may execute a control operation on at least one selected memory cell transistor among the plurality of memory cell transistors MCT. The decoder circuit 1110 and the page buffer 1120 may be controlled by a logic circuit 1130. The semiconductor device 1100 may further include an input/output pad 1101. The semiconductor device 1100 may communicate with the controller 1200 through the input/output pad 1101 electrically connected to the logic circuit 1130. The input/output pad 1101 may be electrically connected to the logic circuit 1130 through an input/output connection interconnection 1135 extending from the first structure 1100F to the second structure 1100S.

The controller 1200 may include a processor 1210, a NAND controller 1220, and a host interface 1230. According to example embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate according to predetermined firmware and may access the semiconductor device 1100 by controlling the NAND controller 1220. The NAND controller 1220 may include a controller interface 1221 processing the communication with the semiconductor device 1100. Through the controller interface 1221, a control command for controlling the semiconductor device 1100, data to be written to the memory cell transistors MCT of the semiconductor device 1100, data to be read from the memory cell transistors MCT of the semiconductor device 1100, and the like may be transmitted. The host interface 1230 may provide a communication function between the electronic system 1000 and an external host. When a control command is received from an external host through the host interface 1230, the processor 1210 may control the semiconductor device 1100 in response to the control command.

Figure 19:
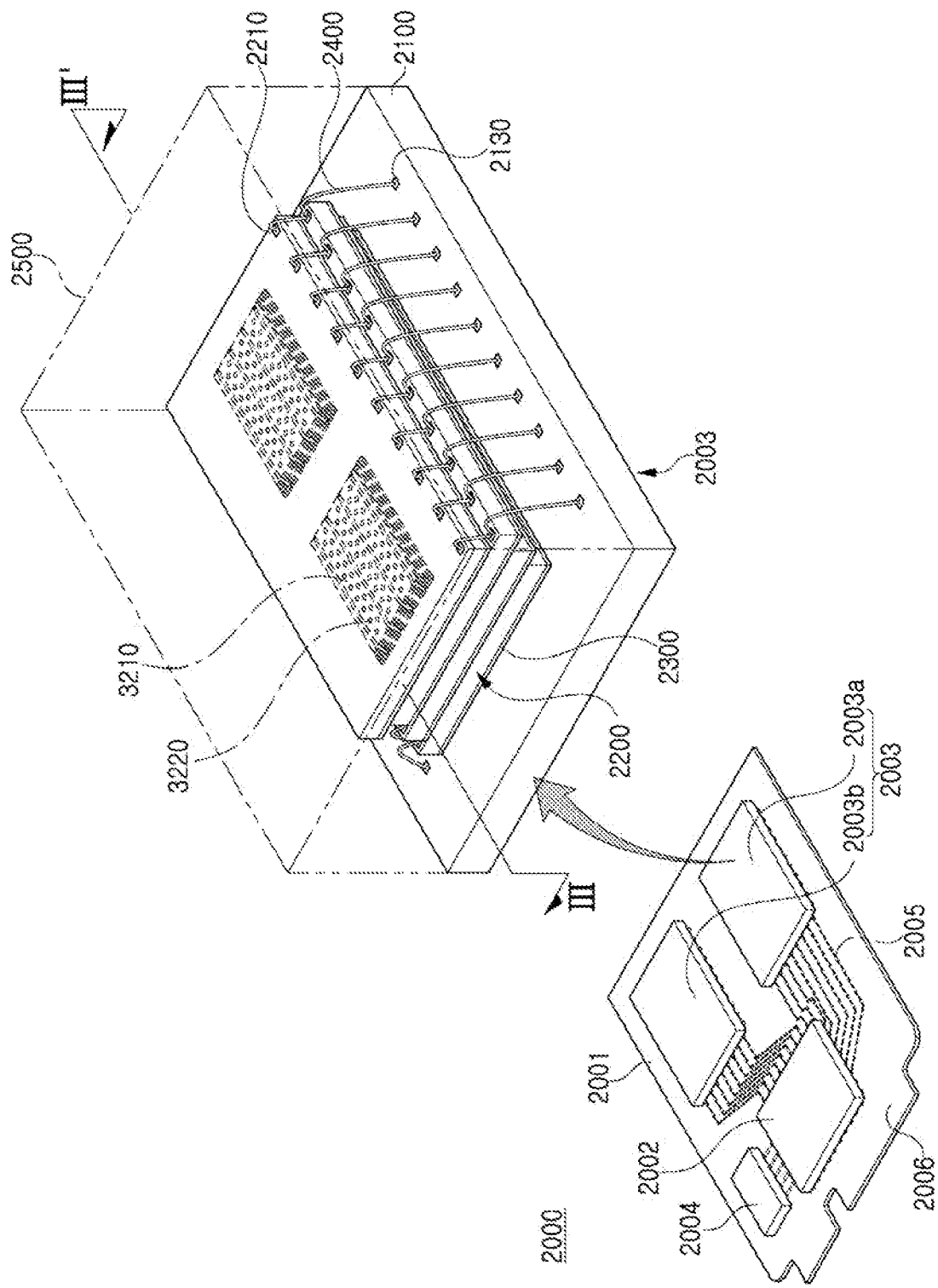
FIG. 19 is a perspective view schematically illustrating an electronic system including a semiconductor device according to an example embodiment.

FIG. 19 is a perspective view schematically illustrating an electronic system including a semiconductor device according to an example embodiment. Referring to FIG. 19, an electronic system 2000 according to an example embodiment of the present inventive concept may include a main substrate 2001, a controller 2002 mounted on the main substrate 2001, one or more semiconductor packages 2003, and a DRAM. 2004. The semiconductor package 2003 and the DRAM 2004 may be connected to the controller 2002 through interconnection patterns 2005 formed on the main substrate 2001.

The main substrate 2001 may include a connector 2006 including a plurality of pins coupled to an external host. The number and disposition of the plurality of pins in the connector 2006 may vary depending on a communication interface between the electronic system 2000 and the external host. According to example embodiments, the electronic system 2000 may communicate with an external host according to any one of interfaces such as universal serial bus (USB), peripheral component interconnect express (PCT-Express), serial advanced technology attachment (SATA), M-Phy for universal flash storage (UFS), and the like. According to example embodiments, the electronic system 2000 may be operated by power supplied from an external host through the connector 2006. The electronic system 2000 may further include a Power Management Integrated Circuit (PMIC) distributing the power supplied from the external host to the controller 2002 and the semiconductor package 2003.

The controller 2002 may write data to the semiconductor package 2003, or read data from the semiconductor package 2003, and may improve an operating speed of the electronic system 2000. The DRAM 2004 may be a buffer memory for mitigating a speed difference between the semiconductor package 2003, which is a data storage space, and an external host. The DRAM 2004 included in the electronic system 2000 may also operate as a kind of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 respectively disposed on a lower surface of each of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 18. Each of the semiconductor chips 2200 may include a gate stack structure 3210 and a memory channel structure 3220. Each of the semiconductor chips 2200 may include the semiconductor device described above with reference to FIGS. 1 to 3.

According to example embodiments, the connection structure 2400 may be a bonding wire electrically connecting the input/output pad 2210 and the package upper pads 2130. Accordingly, in each of first and second semiconductor packages 2003a and 2003b, the semiconductor chips 2200 may be electrically connected to each other using a bonding wire method and may be electrically connected to the package upper pads 2130 of the package substrate 2100. According to example embodiments, in each of the first and second semiconductor packages 2003a and 2003b, the semiconductor chips 2200 may be electrically connected to each other by a connection structure including through silicon vias (TSVs) instead of the bonding wire-type connection structure 2400.

According to example embodiments, the controller 2002 and the semiconductor chips 2200 may be included in one package. According to example embodiments, the controller 2002 and the semiconductor chips 2200 may be mounted on a separate interposer substrate, different from the main substrate 2001, and the controller 2002 and the semiconductor chips 2200 may be connected to each other by interconnections formed on the interposer substrate.

Figure 20:
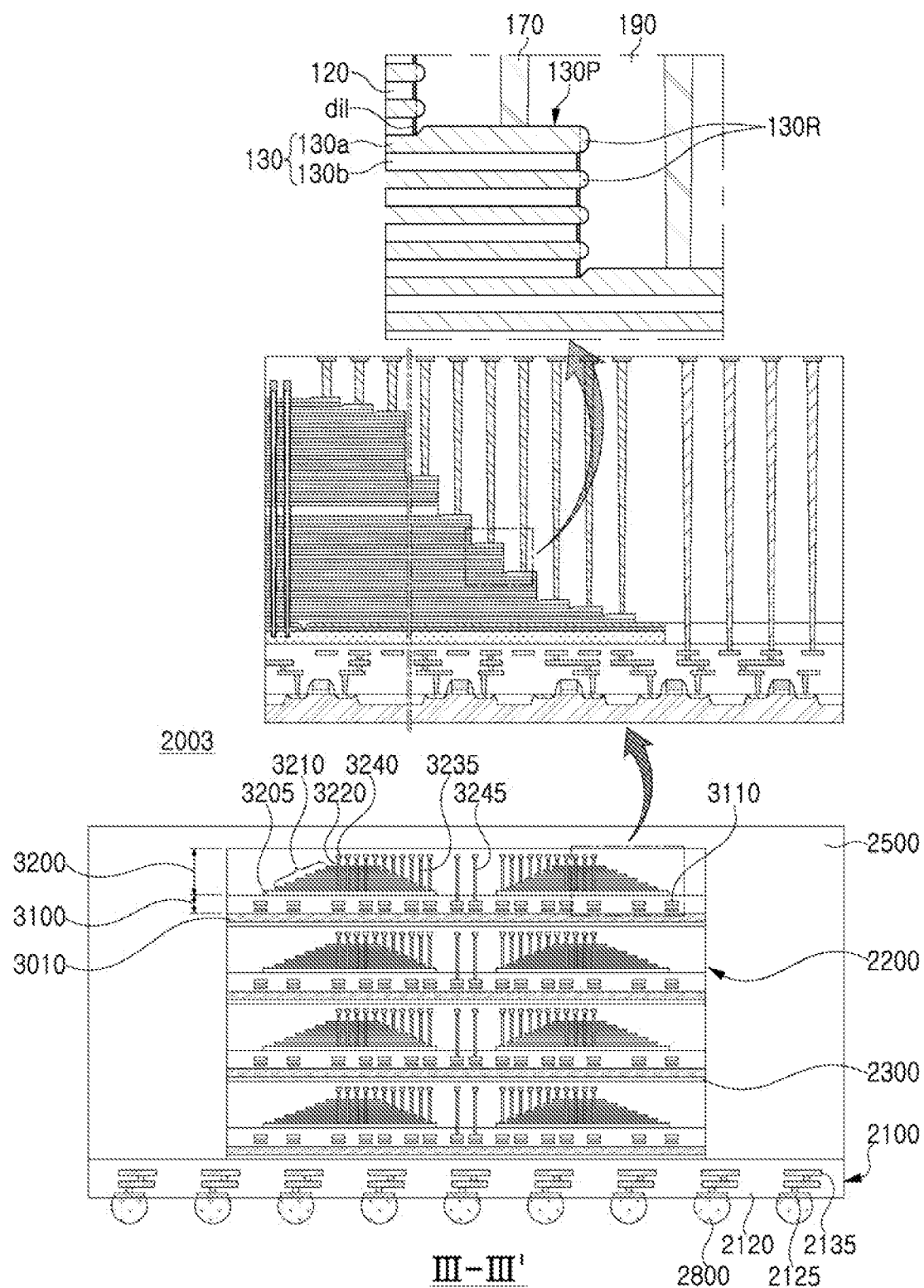
FIG. 20 is a cross-sectional view schematically illustrating a semiconductor package according to an example embodiment.

FIG. 20 is a cross-sectional view schematically illustrating a semiconductor package according to an example embodiment. FIG. 20 illustrates an exemplary embodiment of the semiconductor package 2003 of FIG. 19, and conceptually illustrates a region obtained by cutting the semiconductor package 2003 of FIG. 19 along the cutting line III-III'.

Referring to FIG. 20, in the semiconductor package 2003, a package substrate 2100 may be a printed circuit board. The package substrate 2100 may include a package substrate body unit 2120, package upper pads 2130 disposed on an upper surface of the package substrate body unit 2120 (see. FIG. 19), package lower pads 2125 disposed on a lower surface of the package substrate body unit 2120 or exposed through the lower surface thereof, and internal interconnections 2135 electrically connecting the package upper pads 2130 and the package lower pads 2125 inside the package substrate body unit 2120. The package upper pads 2130 may be electrically connected to connection structures 2400. The package lower pads 2125 may be connected to the interconnection patterns 2005 of the main substrate 2001 of the electronic system 2000 through the conductive connection units 2800 as illustrated in FIG. 19.

Each of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, memory channel structures 3220 penetrating through the gate stack structure 3210 and isolation regions, bit lines 3240 electrically connected to the memory channel structures 3220, and gate contact plugs 3235 electrically connected to word lines WL (see FIG. 18) of the gate stack structure 3210.

Each of the semiconductor chips 2200 may include a through interconnection 3245 electrically connected to the peripheral interconnections 3110 of the first structure 3100 and extending into the second structure 3200. The through interconnection 3245 may be disposed outside the gate stack structure 3210 and may be further disposed to penetrate the gate stack structure 3210. Each of the semiconductor chips 2200 may further include an input/output pad 2210 (see FIG. 19) electrically connected to the peripheral interconnections 3110 of the first structure 3100.

As set forth above, according to the present inventive concept, a method of manufacturing a semiconductor device having improved productivity may be provided by forming selective deposition layers on sacrificial layers through a selective deposition process.

While example embodiments have been shown and described above, it will be apparent to those skilled in the art that modifications and variations could be made without departing from the scope of the present inventive concept as defined by the appended claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming a peripheral circuit structure including a substrate, circuit elements on the substrate, and interconnections on the circuit elements;
   forming a plate layer on the peripheral circuit structure;
   forming a preliminary stack structure by alternately stacking sacrificial layers and interlayer insulating layers on the plate layer in a first direction, perpendicular to an upper surface of the plate layer;
   patterning the preliminary stack structure to form a stepped structure to form patterned sacrificial layers and patterned interlayer insulating layers;
   forming deposition inhibition layers on exposed surfaces of the patterned interlayer insulating layers;
   forming selective deposition layers on exposed surfaces of the patterned sacrificial layers;
   forming channel structures penetrating through the preliminary stack structure in the first direction, and contacting the plate layer;
   forming isolation openings penetrating through the preliminary stack structure in the first direction, and extending in a second direction, parallel to an upper surface of the substrate;
   forming horizontal openings by removing the sacrificial layers and the selective deposition layers exposed through the isolation openings;
   forming gate electrodes filling the horizontal openings; and
   forming gate contacts electrically connected to the gate electrodes.

2. The method of manufacturing a semiconductor device as claimed in claim 1, wherein forming the deposition inhibition layers includes supplying an inhibitor.

3. The method of manufacturing a semiconductor device as claimed in claim 2, wherein the inhibitor includes nitrogen trifluoride ($NF_3$).

4. The method of manufacturing a semiconductor device as claimed in claim 1, wherein forming the selective deposition layers includes supplying a precursor.

5. The method of manufacturing a semiconductor device as claimed in claim 4, wherein the precursor includes one selected from the group consisting of hexachlorodisilane (HCD), dichlorosilane (DCS), tetrachlorosilane (TCS: SiCl$_4$), and trichlorosilane (TCS: SiCl$_3$H).

6. The method of manufacturing a semiconductor device as claimed in claim 1, wherein:
the interlayer insulating layers include silicon oxide or silicon nitride, and
the sacrificial layers include a material different from that of the interlayer insulating layers, the material including silicon, silicon oxide, silicon carbide, or silicon nitride.

7. The method of manufacturing a semiconductor device as claimed in claim 1, wherein each of the deposition inhibition layers is a single layer containing a fluorine element.

8. The method of manufacturing a semiconductor device as claimed in claim 1, wherein the forming of the selective deposition layers is performed through an atomic layer diffusion (ALD) method.

9. The method of manufacturing a semiconductor device as claimed in claim 8, wherein the forming of the selective deposition layers further includes an annealing operation.

10. The method of manufacturing a semiconductor device as claimed in claim 8, wherein the forming of the selective deposition layers further includes performing a plasma nitridation process.

11. The method of manufacturing a semiconductor device as claimed in claim 1, wherein the gate electrodes include a pad region in which a lower gate electrode extends further in the second direction than an upper gate electrode and wherein the pad region is exposed from the interlayer insulating layers, the gate electrodes having an increased thickness in the pad region.

12. The method of manufacturing a semiconductor device as claimed in claim 11, wherein the gate electrodes have a curved side surface protruding from the pad region.

13. The method of manufacturing a semiconductor device as claimed in claim 11, wherein the gate electrodes include a first gate electrode forming the pad region and a second gate electrode lower than the first gate electrode in the first direction.

14. The method of manufacturing a semiconductor device as claimed in claim 13, wherein the second gate electrode has an upper surface having a protruding curved shape.

15. The method of manufacturing a semiconductor device as claimed in claim 1, wherein the selective deposition layers include the same material as the sacrificial layers.

16. The method of manufacturing a semiconductor device as claimed in claim 1, wherein the gate contacts recess upper portions of the gate electrodes.

17. A method of manufacturing a semiconductor device, the method comprising:
forming a preliminary stack structure by alternately stacking sacrificial layers and interlayer insulating layers on a plate layer in a first direction, perpendicular to an upper surface of the plate layer;
patterning the preliminary stack structure to form a stepped structure to form patterned sacrificial layers and patterned interlayer insulating layers;
forming deposition inhibition layers on exposed surfaces of the patterned aver insulating layers by supplying; an inhibitor;
forming selective deposition layers on exposed surfaces of the patterned sacrificial layers by supplying a precursor;
forming isolation openings penetrating through the preliminary stack structure in the first direction, and extending in a second direction, parallel to an upper surface of the plate layer;
forming horizontal openings by removing the sacrificial layers and the selective deposition layers exposed through the isolation openings; and
forming gate electrodes filling the horizontal openings.

18. The method of manufacturing a semiconductor device as claimed in claim 17, further including:
forming openings penetrating through the selective deposition layers and the preliminary stack structure in the first direction, and penetrating through the plate layer and extending further downwardly than the plate layer in the first direction, wherein the forming openings is performed after the forming of the selective deposition layers; and
forming gate contacts filling at least a portion of the openings and contacting the gate electrodes, wherein the forming gate contacts is performed after the forming of the gate electrodes.

19. The method of manufacturing a semiconductor device as claimed in claim 17, further including:
forming a first semiconductor structure including:
a substrate,
circuit elements on the substrate, and
interconnections on the circuit elements;
forming a second semiconductor structure including:
forming the preliminary stack structure,
forming the patterned sacrificial layers and the patterned interlayer insulating layers,
forming the deposition inhibition layers,
forming the selective deposition layers,
forming the isolation openings,
forming the horizontal openings, and
forming the gate electrodes; and
bonding the first semiconductor structure and the second semiconductor structure.

20. A method of manufacturing a semiconductor device, the method comprising:
forming a preliminary stack structure by alternately stacking sacrificial layers and interlayer insulating layers on a plate layer in a first direction, perpendicular to an upper surface of the plate layer;
patterning the preliminary stack structure to form a stepped structure to form patterned sacrificial layers and patterned interlayer insulating layers, and forming preliminary pads, regions in which the sacrificial layers are exposed upwardly;
passivating exposed side surfaces of the patterned interlayer insulating layers by supplying an inhibitor;
forming selective deposition layers on exposed upper and side surfaces of the preliminary pads by supplying a precursor;
forming isolation openings penetrating through the preliminary stack structure in the first direction, and extending in a second direction, parallel to an upper surface of the plate layer;
forming horizontal openings by removing the sacrificial layers and the selective deposition layers exposed through the isolation openings; and
forming gate electrodes filling the horizontal openings.

* * * * *